United States Patent
Yamazaki

(10) Patent No.: US 7,922,819 B2
(45) Date of Patent: Apr. 12, 2011

(54) SEMICONDUCTOR MANUFACTURING DEVICE

(75) Inventor: Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/772,267

(22) Filed: Feb. 6, 2004

(65) Prior Publication Data

US 2005/0167404 A1 Aug. 4, 2005

(30) Foreign Application Priority Data

Feb. 6, 2003 (JP) ................................. 2003-029116

(51) Int. Cl.
C23C 16/00 (2006.01)
C23F 1/00 (2006.01)
H01L 21/306 (2006.01)

(52) U.S. Cl. ................ 118/719; 118/723 R; 156/345.31

(58) Field of Classification Search .................. 118/718, 118/719; 156/345.31
See application file for complete search history.

(56) References Cited

U.S. PATENT DOCUMENTS

| | | | |
|---|---|---|---|
| 4,328,257 A * | 5/1982 | Muehlberger et al. | 427/456 |
| 5,429,994 A | 7/1995 | Ishikawa | |
| 5,483,082 A | 1/1996 | Takizawa et al. | |
| 5,549,780 A | 8/1996 | Koinuma et al. | |
| 5,563,095 A * | 10/1996 | Frey | 438/62 |
| 5,580,796 A | 12/1996 | Takizawa et al. | |
| 5,679,167 A * | 10/1997 | Muehlberger | 118/723 DC |
| 5,824,361 A | 10/1998 | Asanuma | |
| 6,051,150 A | 4/2000 | Miyakawa | |
| 6,203,619 B1 * | 3/2001 | McMillan | 118/719 |
| 6,429,400 B1 | 8/2002 | Sawada et al. | |
| 6,660,545 B2 | 12/2003 | Furusawa | |
| 6,697,698 B2 | 2/2004 | Yoshitake et al. | |
| 6,801,827 B2 | 10/2004 | Yoshitake et al. | |
| 6,871,943 B2 | 3/2005 | Ogawa | |
| 6,909,477 B1 | 6/2005 | Yi et al. | |
| 7,629,033 B2 | 12/2009 | Hongo et al. | |
| 2001/0027013 A1 | 10/2001 | Tsutsui | |
| 2002/0002948 A1 | 1/2002 | Hongo et al. | |
| 2002/0067400 A1 * | 6/2002 | Kawase et al. | 347/101 |
| 2002/0109143 A1 | 8/2002 | Inoue | |
| 2002/0128515 A1 | 9/2002 | Ishida et al. | |
| 2002/0151171 A1 | 10/2002 | Furusawa | |

(Continued)

FOREIGN PATENT DOCUMENTS

EP 1071117 A2 * 1/2001

(Continued)

OTHER PUBLICATIONS

International Search Report Dated Apr. 6, 2004 of PCT/JP2004/000932.

(Continued)

*Primary Examiner* — Karla Moore
(74) *Attorney, Agent, or Firm* — Nixon Peabody LLP; Jeffrey L. Costellia

(57) ABSTRACT

Reduction in a space of a manufacturing line, improvement of efficiency, improvement of utilization efficiency of materials, additionally, reduction in the manufacturing cost is realized by applying a means for describing a wiring pattern or a resist pattern directly on a substrate, a means for locally performing a vapor phase process such as film formation or etching under atmospheric pressure or adjacent to atmospheric pressure.

40 Claims, 13 Drawing Sheets

U.S. PATENT DOCUMENTS

| | | |
|---|---|---|
| 2003/0054653 A1 | 3/2003 | Yamazaki et al. |
| 2003/0059975 A1 | 3/2003 | Sirringhaus et al. |
| 2003/0059984 A1 | 3/2003 | Sirringhaus et al. |
| 2003/0059987 A1 | 3/2003 | Sirringhaus et al. |
| 2003/0060038 A1 | 3/2003 | Sirringhaus et al. |
| 2003/0132987 A1 | 7/2003 | Ogawa |
| 2004/0050685 A1 | 3/2004 | Yara et al. |
| 2004/0075396 A1 | 4/2004 | Okumura et al. |
| 2004/0224433 A1 | 11/2004 | Yamazaki et al. |
| 2004/0253896 A1 | 12/2004 | Yamazaki |
| 2004/0266073 A1 | 12/2004 | Yamazaki |
| 2005/0011752 A1 | 1/2005 | Yamazaki et al. |
| 2005/0013927 A1 | 1/2005 | Yamazaki |
| 2005/0064091 A1 | 3/2005 | Yamazaki |
| 2005/0090029 A1 | 4/2005 | Yamazaki et al. |
| 2005/0167404 A1 | 8/2005 | Yamazaki |
| 2007/0251453 A1 | 11/2007 | Hongo et al. |

FOREIGN PATENT DOCUMENTS

| | | |
|---|---|---|
| EP | 1 340 838 A1 | 9/2003 |
| JP | 06-202153 | 7/1994 |
| JP | 07-024579 | 1/1995 |
| JP | 09-320363 | 12/1997 |
| JP | 10-062814 | 3/1998 |
| JP | 11-340129 | 12/1999 |
| JP | 2000-169977 | 6/2000 |
| JP | 2000-328269 | 11/2000 |
| JP | 2001-068827 | 3/2001 |
| JP | 2001-093871 | 4/2001 |
| JP | 2001-179167 | 7/2001 |
| JP | 2002-066391 | 3/2002 |
| JP | 2002-151478 | 5/2002 |
| JP | 2002-237463 | 8/2002 |
| JP | 2002-237480 | 8/2002 |
| JP | 2002-289864 | 10/2002 |
| JP | 2002-324966 | 11/2002 |
| JP | 2002-359246 | 12/2002 |
| JP | 2002-359347 | 12/2002 |
| JP | 2002-367774 | 12/2002 |
| JP | 2003-017413 | 1/2003 |
| JP | 2003-031477 | 1/2003 |
| JP | 2003-311197 | 11/2003 |
| JP | 2003-347284 | 12/2003 |
| KR | 2001-0093073 A | 10/2001 |
| WO | WO-01-47044 | 6/2001 |
| WO | WO 02/40742 A1 | 5/2002 |
| WO | WO-2004/070809 | 8/2004 |
| WO | WO-2004/070810 | 8/2004 |
| WO | WO 2004/070811 A1 | 8/2004 |
| WO | WO-2004/070819 | 8/2004 |
| WO | WO-2004/070820 | 8/2004 |
| WO | WO-2004-070821 | 8/2004 |
| WO | WO-2004-070822 | 8/2004 |
| WO | WO-2004-070823 | 8/2004 |

OTHER PUBLICATIONS

International Search Report (Application No. PCT/JP2004/000895) and Written Opinion dated Apr. 27, 2004 with partial translation of Written Opinion.

International Search Report (Application No. PCT/JP2004/000897) and Written Opinion dated Apr. 27, 2004 with partial translation of Written Opinion.

International Search Report (Application No. PCT/JP2004/000899) and Written Opinion dated Apr. 27, 2004 with partial translation of Written Opinion.

International Search Report (Application No. PCT/JP2004/000900) and Written Opinion dated Jun. 1, 2004 with partial translation of Written Opinion.

International Search Report (Application No. PCT/JP2004/000915) and Written Opinion dated Apr. 27, 2004 with partial translation of Written Opinion.

International Search Report (Application No. PCT/JP2004/000918) and Written Opinion dated Apr. 27, 2004 with partial translation of Written Opinion.

International Search Report (Application No. PCT/JP2004/000930) and Written Opinion dated Apr. 13, 2004 with partial translation of Written Opinion.

S. Wolf et al. *"Silicon Processing for the VLSI ERA"* vol. 1 (Process Technology), pp. 198, 408, 427, 539, 542, 535; Jan. 1, 1986.

International Application No. PCT/JP2004/000932—Written Opinion dated Apr. 6, 2004 with partial translation of Written Opinion.

Korean Office Action (Application No. 2005-7013795; PCTKR06953) Dated Nov. 16, 2010.

* cited by examiner

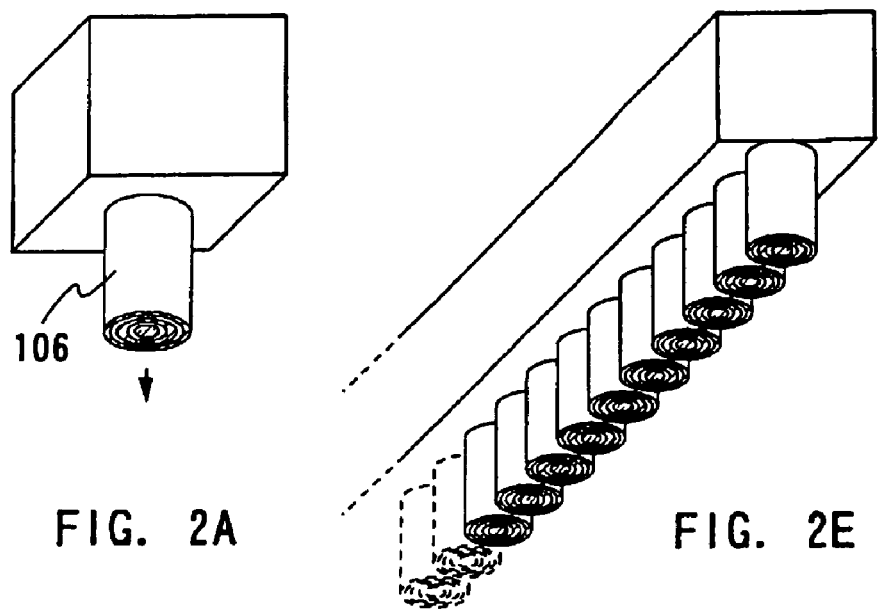
FIG. 2A
FIG. 2E
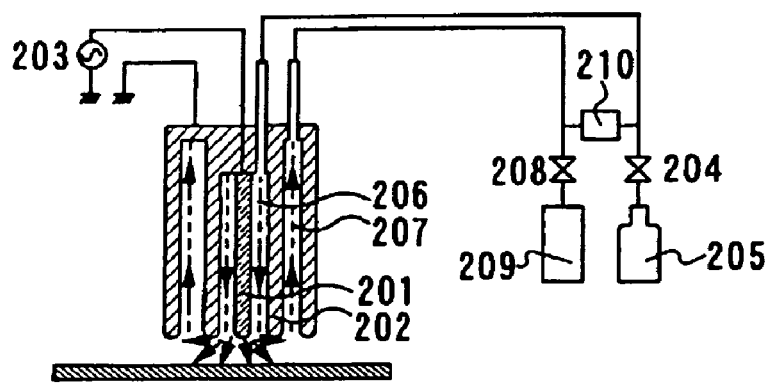
FIG. 2B
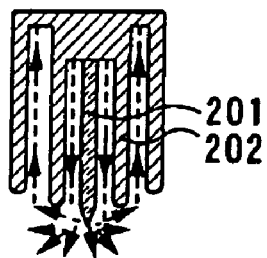
FIG. 2C
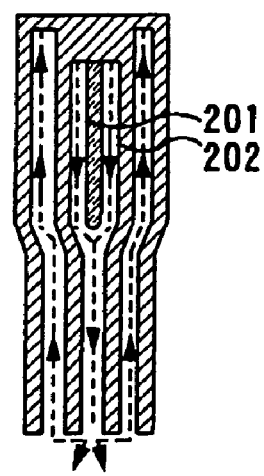
FIG. 2D

SEMICONDUCTOR MANUFACTURING DEVICE

BACKGROUND OF THE INVENTION

1. Technical Field

The present invention relates to a semiconductor manufacturing apparatus which forms a wiring, a contact hole and a display device. More specifically, the invention relates to a manufacturing method of a resist pattern by a droplet spraying method (an ink-jet method and a droplet discharging method), a manufacturing method of a metal wiring pattern by a droplet spraying method (an ink-jet method and a droplet discharging method) and a semiconductor manufacturing apparatus which forms a wiring, a contact hole and display device by using either a local CVD (Chemical Vapor Deposition) method or a local etching method performed under atmospheric pressure or adjacent to atmospheric pressure. In addition, the invention relates to a semiconductor manufacturing apparatus which forms or etches a thin film.

2. Background Art

In recent years, attention has been paid to a large-screen television with a diagonal size of 20 inches or more. However, it is said that the conventional CRT (cold-cathode tube) has a limitation to make a television larger. Therefore, a PDP (plasma display panel) and LCD (liquid crystal display) are manners put to practical use in recent years. In addition, an EL (electro luminescence) display device is considered to be a dominant display device in future. Particularly, a television of an LCD method is now drawing a keen attention in view of light-weight, reduction in space and energy consumption saving or the like.

A thin film transistor (TFT) formed by using a thin film over an insulating surface is widely used for an electro-optic device typified by an LCD (liquid crystal display) or an EL (electro luminescence) display device. A TFT is widely applied to an integrated circuit or the like, and in the most cases, is used as a switching element. A TFT is increasingly an essential technology for a display device due to the increasing demand for high precision of a screen, high aperture ratio, high reliability and jumboization of a screen.

Regarding to manufacturing of a circuit pattern of a TFT, a vacuum process performed in the condition in which inside of a treatment apparatus is made depressurized or vacuumized or a photolithography process in which a mask formed of a resist (a photoresist) is manufactured and then an unnecessary portion thereof is etched and removed by an exposure device.

In the vacuum process, an exhaust means to vacuumize or depressurize a process chamber which performs treatment such as forming a film, etching or the like to an object to be processed is needed. The exhaust means comprises a pump typified by a turbo-molecular pump, a rotary pump or the like installed outside of the treatment apparatus, a means for supervising and controlling the pump, or a pipe, a valve or the like composing an exhaust system by connecting the pump and the treatment chamber. The space for the exhaust means is required outside of the treatment apparatus to equip these facilities and the cost of the equipment is also required. Moreover, an exhaust system facility is needed to be installed in a treatment chamber itself; therefore, the size of the treatment apparatus increases in comparison with that of a apparatus without the exhaust system.

A conventional photolithography process for forming a circuit pattern such as a TFT, for example, a photolithography process for forming a metal wiring is performed as follows. First, a metal thin film is formed over a substrate typified by glass. Next, a photosensitive resist (a photoresist) is applied on the metal thin film by spinning to form the resist on the entire surface of the metal thin film then followed by prebaking. Then, light irradiation is performed through a photomask over which a desired pattern is formed. At this time, a resist which is not shielded by the pattern from light is exposed to light because the pattern on the photomask functions as a light shielding pattern and can be removed by etching with a developing solution. Consequently, the pattern of the photomask is transcribed as a resist pattern by performing development and baking. Furthermore, the metal thin film which is not shielded by the resist pattern is etched and removed by soaking into a solution which dissolves the metal film using the resist formed in a pattern shape as a mask. Finally, a metal wiring the same as the pattern formed over the photomask is formed by peeling the resist pattern.

SUMMARY OF THE INVENTION

However, a rate in which a wiring or the like remains on a substrate is just several to several dozen percentage because most of a coat (a resist film, a metal film, a semiconductor film or the like) formed over the entire surface of the substrate is removed by etching in the conventional technology. About 95 percent of a resist film is wasted when it is formed by a spin coating. In other words, most of the material are thrown, which not only affects the manufacturing cost, but also increased environmental burden.

This tendency is more apparent as a large-sized screen of a display device is developed. This is because glass which flows to a manufacturing line, so-called mother glass becomes inevitably large in size.

Mother glass is slightly different in size according to manufacturing companies. However, the size 730×920 mm in the fourth generation, as large as 1100×1250 mm in the fifth generation and 1800×2000 mm is considered as the sixth generation.

In addition, as the size of a substrate gets larger, a manufacturing apparatus also becomes inevitably larger. Therefore, an extremely large floor space is needed. In particular, aside from jumboizing of a film formation chamber, scale of a supplementary vacuum pump or the like also gets larger because a film formation process is essentially performed in vacuum; therefore, an occupied area of the device gets large limitlessly.

Therefore, in the present invention, a means for describing a wiring pattern or a resist pattern directly over a substrate, and additionally, a means for locally performing a vapor phase process such as a film formation or etching under atmospheric pressure or adjacent to atmospheric pressure are applied to solve the above problem.

One feature of the invention is a semiconductor manufacturing apparatus having a means for transferring an object to be processed, at least one plasma generating means for performing film formation treatment, etching treatment or ashing treatment and a means for moving the plasma generating means in the intersecting direction with a transferring direction of the object to be processed, and the film formation treatment, the etching treatment or the ashing treatment is performed on the object to be processed by a combination of the transfer of the object to be processed and the movement of the plasma generating means.

One feature is a semiconductor manufacturing apparatus having a means for transferring an object to be processed and a plurality of plasma generating means for performing film formation treatment, etching treatment or ashing treatment, and the plurality of plasma generating means are arranged in the intersecting direction with a transferring direction of the object to be processed, and film formation treatment, etching treatment or ashing treatment is performed on the object to be processed by transfer of the object to be processed and generating plasma in at least one of the plurality of plasma generating means.

One feature is a semiconductor manufacturing apparatus having a means for transferring an object to be processed, at least one droplet spraying means to spray a droplet onto a surface of the object to be processed, and a means for moving the droplet spraying means in the intersecting direction with a transferring direction of the object to be processed, and a droplet is attached to the object to be processed by transfer of the object to be processed and a movement of the droplet spraying means.

One feature is a semiconductor manufacturing apparatus having a means for transferring an object to be processed and a plurality of droplet spraying means for spraying a droplet onto a surface of the object to be processed, and the plurality of droplet spraying means are arranged in the intersecting direction with a transferring direction of the object to be processed, and a droplet is attached to the object to be processed by the transfer of the object to be processed and spraying a droplet from at least one of the plurality of droplet spraying means.

One feature is a semiconductor manufacturing apparatus having a means for transferring an object to be processed, at least one plasma generating means for performing film formation treatment, etching treatment or ashing treatment, and at least one droplet spraying means for attaching a droplet onto the object to be processed, and the plasma generating means and the droplet spraying means have a means for moving in the intersecting direction with a transferring direction of the object to be processed, and the film formation treatment, etching treatment or ashing treatment is performed on the object to be processed or a droplet is attached by transfer of the object to be processed, and movement of the plasma generating means and the droplet spraying means.

One feature is a semiconductor manufacturing apparatus having a means for transferring an object to be processed, a plurality of plasma generating means for performing film formation treatment, etching treatment or ashing treatment on the object to be processed, and a plurality of droplet spraying means for attaching a droplet on the object to be processed, and the plurality of plasma generating means are arranged in the intersecting direction with a transferring direction of the object to be processed, and the plurality of droplet spraying means are arranged in the intersecting direction with a transferring direction of the object to be processed, and the film formation treatment, the etching treatment or the ashing treatment is performed by the transfer of the object to be processed and generating plasma in at least one of the plurality of plasma generating means, then a droplet is attached on the object to be processed by movement of the object to be processed and by spraying the droplet from a droplet spraying means.

One feature of a plasma generating means used in the invention is that plasma is generated under atmospheric pressure or adjacent to atmospheric pressure, and any one of film formation treatment, etching treatment or ashing treatment can be performed by selecting the kind of gas to be supplied. In addition, as an example of a shape of the plasma generating means, it has a second electrode surrounding a first electrode, and it is cylindrical having a nozzle-shaped gas narrow opening at a tip thereof. Then one feature is a mechanism in which a space between the both electrodes is supplied with a process gas, plasma is generated between the both electrodes and an object to be processed is irradiated with a reactive gas flow containing chemically active exited species such as ion or radical generated by plasma.

The droplet spraying method used in the invention corresponds to a so-called piezo method using a piezoelectric element, or according to a kind of a droplet, a method using a so-called thermal ink-jet method in which a droplet is pushed out by having a heating element generate heat to generate an air bubble.

A droplet can be sprayed on an object to be processed by the aforementioned means. In a droplet spraying method, there are a so-called sequential method in which a continuous linear pattern is formed by spraying a droplet sequentially, and a so-called on demand method in which a droplet is sprayed in dot. In the case that a continuous linear pattern is formed, it is preferable to use a dispenser method.

The invention having the abovementioned configuration enables to improve reduction in a space of a manufacturing line and efficiency, contributes to significant quality improvement, productivity improvement and manufacturing cost reduction in manufacturing a display panel, and provides a method for forming a wiring pattern or a contact hole adapted to the earth environment and a method of manufacturing various deposition devices and display devices. In addition, high-speed and continuous treatment is possible because the invention is an atmospheric pressure method which can perform in-line treatment coupled with production. Moreover, there are few unnecessary materials because only a required amount of materials may be used in a desired part. Therefore, usability improvement of a material as well as reduction in manufacturing expense can be achieved.

BRIEF DESCRIPTION OF DRAWINGS

FIGS. 2A TO 2E are drawings showing plasma generating means.

DETAILED DESCRIPTION OF THE INVENTION

The embodiment mode of the present invention are described hereinafter.

Embodiment Mode 1

First, as a feature of the present invention, performing deposition treatment or etching treatment under atmospheric pressure or adjacent to atmospheric pressure (5 to 800 Torr, $6.6 \times 10^2$ to $1.1 \times 10^5$ Pa) by using a plasma generating means is given. As an example of plasma treatment apparatus used in the invention, apparatus having a cylindrical electrode having a nozzle-shaped narrow opening at a tip thereof, in which a first electrode surrounds a second electrode, is described with reference to FIG. 1A to 2E.

Figure 1A:
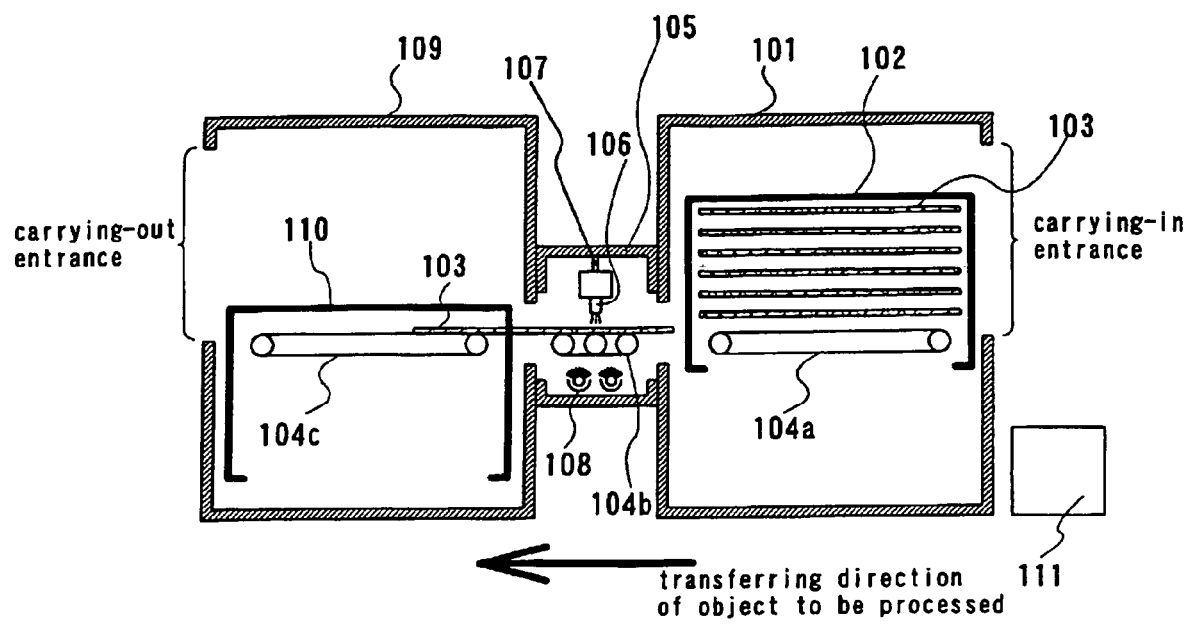
FIG. 1A and FIG. 1B are drawings showing semiconductor manufacturing apparatus.
Figure 1B:
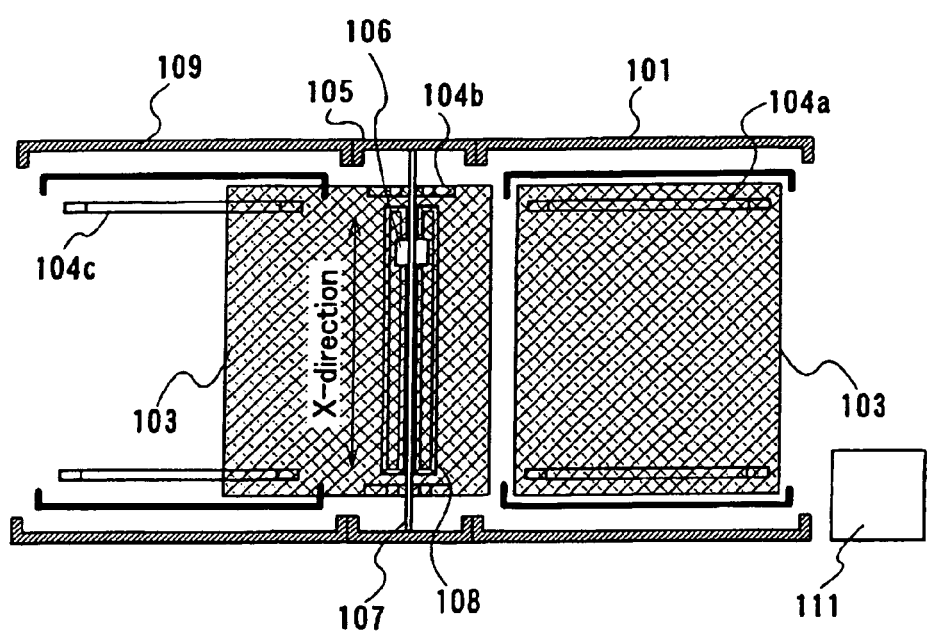

FIG. 1A is a side view of an example of the plasma treatment apparatus used in the invention and FIG. 1B is a top view thereof. In the drawings, a desired sized object to be processed 103 in a cassette 102 such as a glass substrate, a resin substrate typified by a plastic substrate, or such as a semiconductor wafer typified by silicon is placed in a load chamber 101. As a transferring means of the object to be processed 103, level transfer is given. However, when a substrate of the post-fifth generation is used, longitudinal transfer in which a substrate is placed longwise may be performed for reducing an occupied area.

A transferring means 104a is arranged in the load chamber 101. The transferring means 104a transfers the object to be processed 103 arranged in the load chamber 101 to a treatment chamber 105. In the treatment chamber 105, a plasma generating means 106 having a cylindrical electrode, a rail 107 to move the plasma generating means 106, a moving means 104b to perform movement of the object to be processed 103, a heating means 108 to heat the substrate and the like are provided. As the heating means 108, a known heating means such as a heater or a lump may be used if necessary.

The object to be processed in which plasma treatment is performed in the treatment chamber 105 is transmitted to an unload chamber 109 by a transferring method 104c and stored in a cassette 110 inside the unload chamber.

As for the plasma treatment, deposition treatment or etching treatment can be selected over the surface of the object to be processed by appropriately selecting a kind of a gas to discharge to a space between the both electrodes of the plasma generating means 106. Ashing treatment for ashing-removing an organic material is a kind of etching treatment. As the kind of the gas, the known gas such as silane, disilane, hydrogen, oxygen, nitrogen, ammonia, fluorine, chlorine, nitrogen trifluoride or carbon tetrafluoride may be used, or may be used by appropriately combining according to a purpose. An inert gas may be added for the purpose of dilution or stabilization of plasma.

The rail 107 is a mechanism to support the plasma generating means 106 and to move the plasma generating means 106 to an arbitrary point of the X-direction which intersects (orthogonalizes) with a transferring (moving) direction of the object to be processed. When the object to be processed 103 begins to be transferred inside the treatment chamber, the plasma generating means 106 moves along the X-direction by the rail 107, and is installed in a primary predetermined position where plasma treatment is to be performed. Afterwards, when the object to be processed 103 reaches the predetermined position where the plasma generating means 106 is installed, the plasma treatment is started. The object to be processed 103 may be continuously moved or may be moved twitchily which is so-called step feed.

A control means 111 controls a relative position of the plasma generating means 106 and the object to be processed 103 or the parameters of the plasma treatment the like at once.

When data of a pattern which is formed on the object to be processed 103 is inputted into the control means 111 to control for performing the plasma treatment on the object to be processed 103 at an arbitrary position, it becomes possible to form an arbitrary pattern directly without using a member such as a photoresist, a photomask or a developing solution, though form accuracy is inferior to the case with the use of a photolithography process. Therefore, an etching process also becomes unnecessary.

Moreover, when the control means 111 is connected to a production management system or the like by a LAN cable, a wireless LAN, an optical fiber or the like, it becomes possible to manage the process uniformly from the outside and result in a productivity improvement.

Although only one plasma generating means 106 is shown in the drawings, it becomes possible to further shorten the processing time by placing plurality of plasma generating means.

Since most of the plasma apparatus perform the treatment under reduced pressure, a vacuuming process and an atmosphere relieving process are required. Therefore, it is necessary to keep each space of a load chamber, a treatment chamber and an unload chamber independently; therefore it is inevitable for an object to be processed to transfer each space successively. Inevitably, the load chamber, the treatment chamber or the like has a larger space than the object to be processed.

On the contrary, it is possible to make the treatment chamber of this apparatus smaller than the object to be processed because treatment is performed by continuously moving the object to be processed. As well as dramatic reduction in the processing time, a maintenance performance is drastically improved since there are no need for a mechanism which performs a vacuuming or an atmosphere relieving, or a mechanism to keep each space independently.

Next, FIGS. 2A to 2E are used to describe the plasma generating means 106 in detail. FIG. 2A shows a perspective view of the plasma generating means 106 having a cylindrical electrode, and FIGS. 2B to 2D show cross-sectional views of the cylindrical electrode.

In FIG. 2B, dotted lines show a path of a gas, and reference numerals 201 and 202 denote electrodes formed of metal having conductivity such as aluminum and copper, and the first electrode 201 is connected to a power source (a high frequency power source) 203. In addition, a cooling system to circulate cooling water (not shown) may be connected to the first electrode 201. When the cooling system is provided, a temperature rise in the case of performing surface treatment continuously is prevented by a circulation of cooling water; therefore an efficiency improvement is possible by continuous treatment. The second electrode 202 has a shape surrounding the first electrode 201 and is electrically grounded. Then, the first electrode 201 and the second electrode 202 are cylindrical having a nozzle-shaped gas narrow opening at a tip thereof. In addition, although it is not shown in the drawing, at least one of the surface of the electrodes of the first electrode 201 or the second electrode 202 is covered with a solid dielectric. As the solid dielectric, metal oxide such as silicon dioxide, aluminum oxide, zirconium dioxide or titanium dioxide, plastic such as polyethylene terephthalate, polytetrafluoroethylene, glass or oxide complex such as barium titanate or the like can be given. Although the solid dielectric may be either sheet-shape or film-shape, it is preferable that the thickness is 0.05 to 4 mm.

Additionally, a space between the first electrode 201 and the second electrode 202 is supplied with a process gas 206 from a gas supply means (a gas cylinder) 205 through a valve 204. Then, atmosphere of the space is replaced, and plasma is generated in the space when a high frequency voltage (10 to 500 MHz) is applied to the first electrode 201 in this state by the high frequency power source 203. When a reactive gas flow containing chemically active excited species such as ion or radical that is generated by the plasma is discharged onto a surface of the object to be processed 103, predetermined surface treatment can be performed over the surface of the object to be processed 103.

Note that a process gas to be filled in the gas supply means (a gas cylinder) 205 is appropriately selected in accordance with a kind of surface treatment performed in a treatment chamber. An exhaust gas 207 is introduced into an exhaust unit 209 through a valve 208.

In addition, not all the process gas 206 is consumed in a plasma process, and an unreacted gas is included in the exhaust gas 207. Generally, the exhaust gas is detoxified in an exhaust gas treatment apparatus, and is disposed or recovered. However, by making a component of the unreacted gas in the exhaust gas reflux as the process gas 206 through a filter 210, the utilization efficiency of the process gas can be raised and the exhaust gas emission can be suppressed.

FIGS. 2C and 2D show a cylindrical plasma generating means 106 having a cross-section different from that of FIG. 2B. FIG. 2C has such a shape that the first electrode 201 is longer than the second electrode 202 and the first electrode 201 is acute-angle. Further, the plasma generating means 106 shown in FIG. 2D has such a shape that a reactive gas flow including chemically excited species generated between the first electrode 201 and the second electrode 202 is discharged externally.

The cylindrical plasma generating means is described as an example in this embodiment mode, but not particularly limited to a cylindrical shape, and a plasma generating means of any shape may be used.

The distance between the tip of the plasma generating means and the surface of the object to be processed is required to be kept equal to or less than 3 mm, preferably equal to or less than 1 mm, and more preferably equal to or less than 0.5 mm. For this reason, the distance between the plasma generating means and the surface of the object to be processed may be kept constant by using a distance sensor, for example.

According to the invention using the plasma treatment apparatus which can be operated under atmospheric pressure, time for vacuuming and atmosphere relieving, which is necessary for a pressure reducing apparatus, is not required, and a complicated vacuum apparatus need not be arranged. Specifically, in the case of using a large-sized substrate, a size of a chamber is consequently enlarged, and longer processing time is required to make inside of the chamber under reduced pressure state. Therefore, the apparatus of the invention that can be operated under atmospheric pressure is effective and enables to reduce the manufacturing cost.

The invention is applicable to various fields such as a wiring forming process of a semiconductor integrated circuit or a wiring forming process of a TFT substrate for forming a liquid crystal panel or an EL panel. That is, the invention is not limited to the illustration in this embodiment mode. The invention is also applicable when an insulating film such as silicon oxide or acrylic resin is formed, or a semiconductor pattern such as polycrystalline silicon or amorphous silicon is formed.

Embodiment Mode 2

Figure 3A:
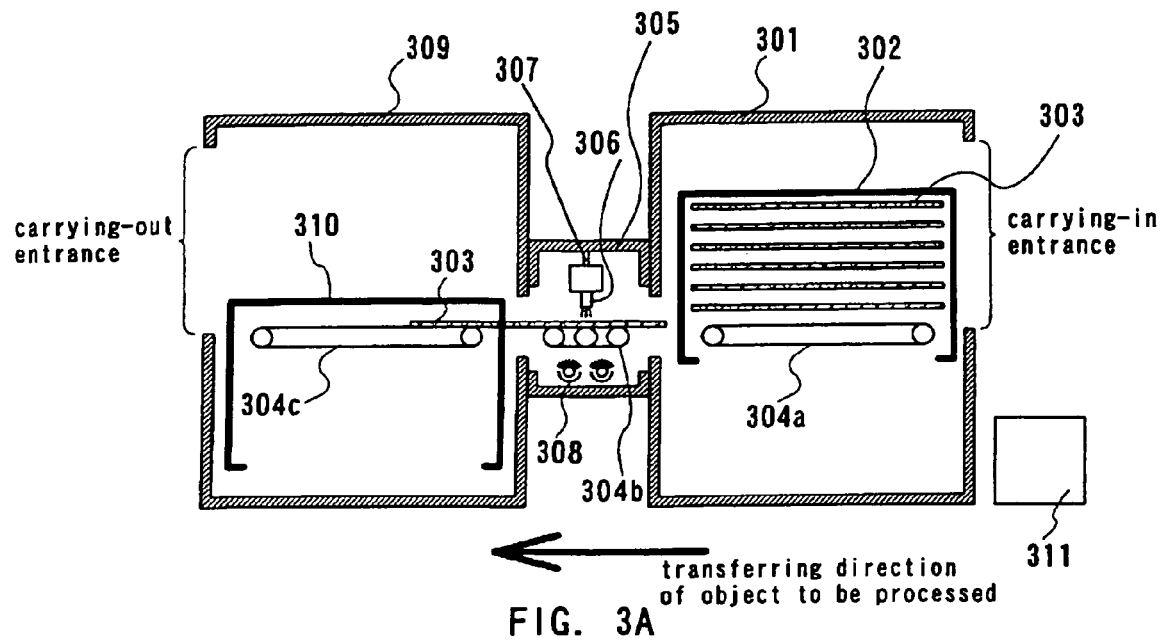
FIGS. 3A TO 3B are drawings showing semiconductor manufacturing apparatus.
Figure 3B:
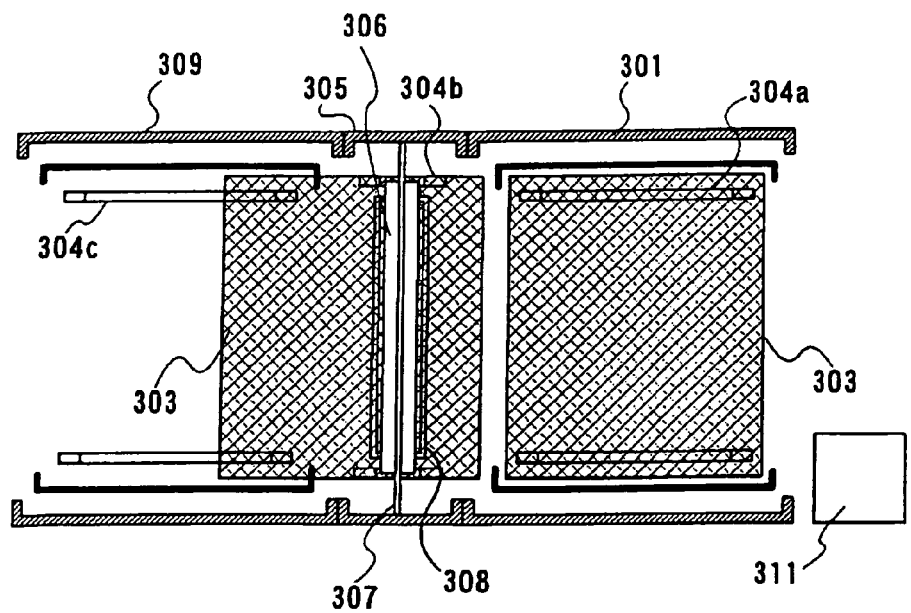

This embodiment mode describes difference with the embodiment mode 1 with reference to FIGS. 3A and 3B. FIG. 3A is a side view of a plasma treatment apparatus used in this embodiment and FIG. 3B is a top view thereof.

A plasma generating means 306 in the embodiment mode is a plasma generating means in which the plasma generating means 106 in the embodiment mode 1 is arranged in the intersecting direction with a transferring direction of an object to be processed 303. (FIG. 2E)

Since plurality of plasma generating means are arranged, the plasma generating means need not be moved; therefore further reduction in the processing time can be achieved.

In addition, films that are different in film qualities can be formed in the same treatment chamber by arranging plurality of plasma generating means 306 and supplying different material gases. That is, it is possible to form a silicon nitride film with a first plasma generating means, then to form a silicon oxide film with other plasma generating means. It is also possible to form a silicon nitride film in some region, to form a silicon oxide film in other region, and further to form a lamination layer of the both in other region based on data being inputted into a controlling means 311. Also the case of forming the same film results in improvement of a substantial film formation rate. When there is a defect in one of the plasma generating means, if plurality of plasma generating means are possessed, redundancy can be given since other plasma generating means can be used as a spare.

Embodiment Mode 3

This embodiment mode is an embodiment mode in which the plasma treatment apparatus in the embodiment mode 1 is applied to a dot-shaped droplet spraying apparatus. The plasma generating means is substituted for a dot-shaped droplet spraying means.

Figure 4:
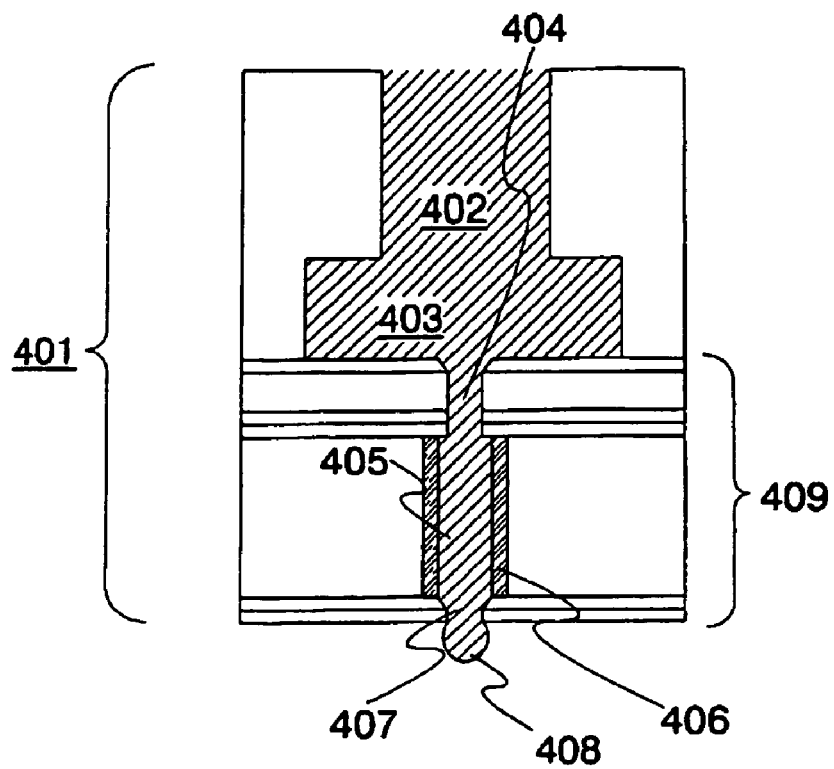
FIG. 4 is a drawing showing a droplet spraying head.

In FIG. 4, an internal structure of the droplet spraying means is described.

A droplet supplied inside a droplet spraying means 401 from the outside is moved to a nozzle portion 409 for spraying the droplet after passing a droplet chamber passage 402 and being stored in a spare droplet chamber 403. The nozzle portion constitutes a fluid resistance portion 404 provided so that a moderate droplet is charged into the nozzle, a pressurization chamber 405 for spraying the droplet outside the nozzle by applying pressure on the droplet, and a droplet spraying hole 407.

On the side wall of the pressurization chamber 405, a piezoelectric element 406 having piezoelectrical effect such as lead titanate zirconate (Pb (Zr, Ti) $O_3$) which transforms by voltage application is arranged. Therefore, a droplet 408 inside of the pressurization chamber 405 can be sprayed outwardly by applying voltage to the piezoelectric element 406 arranged in an objective nozzle to push out the droplet 408.

In the invention, although droplet spraying is performed by a so-called piezo method in which a piezoelectric element is used, according to a material of a droplet, a so-called thermal ink-jet method in which the droplet is pushed out by having a heating element generate heat to generate an air bubble may be used. In this case, it is a structure to substitute the heating element for the piezoelectric element 406.

In addition, in the nozzle portion 409 for droplet spray, wettability of the droplet with the droplet chamber passage 402, the spare droplet chamber 403, the fluid resistance portion 404, the pressurization chamber 405, and further the droplet spraying hole 407 becomes important. Therefore, a carbon film, a resin film or the like for adjusting wettability with a material may be formed in each of passage.

The droplet can be sprayed on the object to be processed by the aforementioned means. In a droplet spraying method, there are a so-called sequential method in which a continuous linear pattern is formed by spraying a droplet sequentially, and a so-called on demand method in which a droplet is sprayed in dot. Although an on demand method is shown in the apparatus structure in the invention, it is also possible to use a head by a sequential method. Especially, when a continuous linear pattern is formed, a dispenser method may be used.

Figure 5A:
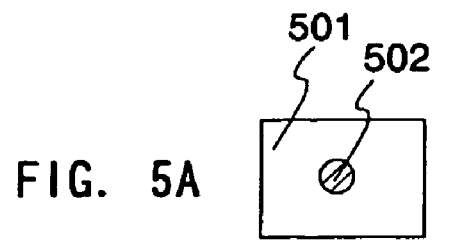
FIG. 5A to 5C are drawings showing droplet spraying heads.
Figure 5B:
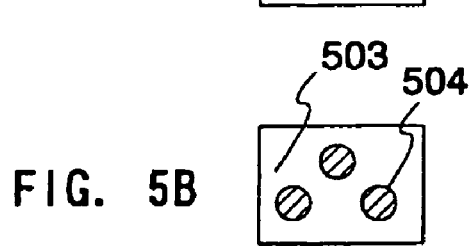
Figure 5C:
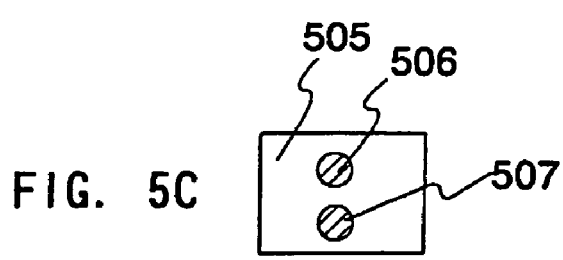

FIGS. 5A to 5C typically show the bottom of the head in the FIG. 4. FIG. 5A is a basic arrangement in which one droplet spraying hole 502 is provided on the bottom face of a head 501. In contrast, FIG. 5B is a so-called cluster-shaped arrangement in which a droplet spraying hole 504 on the bottom surface of a head 503 is increased to three points to constitute a triangle. In addition, FIG. 5C is an arrangement in which droplet spraying holes on a bottom surface of a head 505 are arranged up and down. In this arrangement, after droplet spraying from an upper droplet spraying hole 506, by spraying a similar droplet on a similar point from a lower droplet spraying hole 507 with time difference, a droplet can be made thicker by further overpainting a droplet before the droplet which has already been sprayed is dried or solidified on the substrate. In addition, when the upper droplet spraying hole is clogged with a droplet or the like, the lower droplet spraying hole can be functioned as a spare.

As the droplet of the aforementioned droplet spraying apparatus, a resist, a metal material in paste form or an organic solvent including the metal material in paste form, furthermore, a metal material in ultrafine particle form or an organic solvent including the metal material in ultrafine particle form may be used.

The size of a metal particle in an organic solvent may be set equal to or less than 10 µm, preferably equal to or less than 1 µm, more preferably equal to or less than 100 nm to keep a feature of a coat favorable in a contact hole in particular.

These droplets may be heated and dried by using a heating means at the time of droplet landing, or may be heated and dried after the droplets completed to land to a necessary portion. The resist is baked by heating treatment and may be used as a mask at the time of etching. In addition, as for the organic solvent including a metal material in ultrafine particle form, the organic solvent is volatilized by heating treatment and metal in ultrafine particle form is combined; therefore it can be used as a metal wiring. In addition, a photosensitive resist need not be used if the droplet functions as a resist because a process of exposing to light with the use of a photomask becomes unnecessary in the invention.

Embodiment Mode 4

This embodiment mode describes a linear droplet spraying apparatus as a different spraying apparatus from the aforementioned dot-shaped droplet spraying apparatus.

Figure 6:
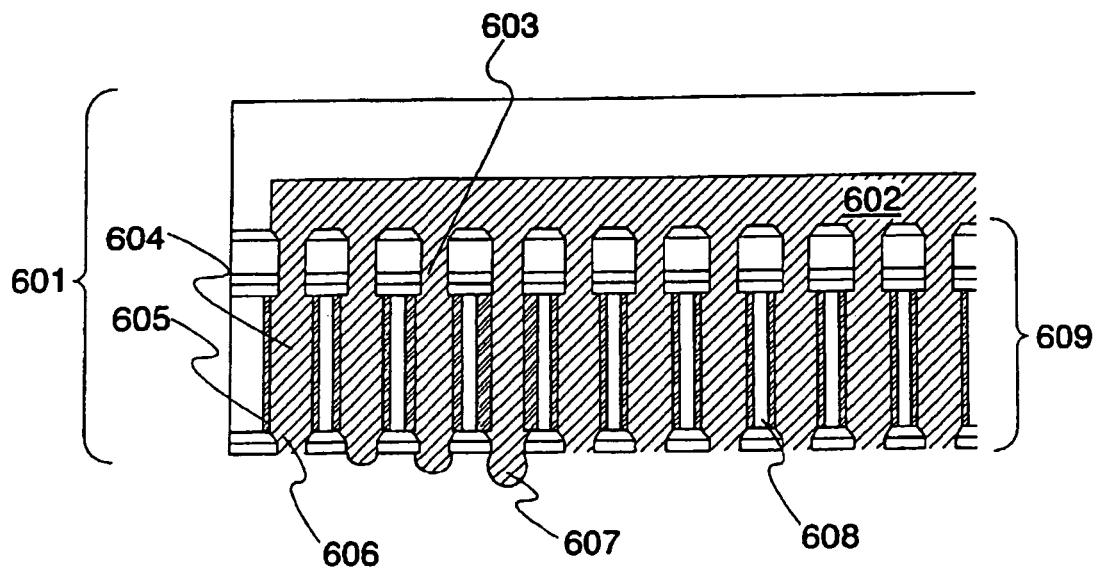
FIG. 6 is a drawing showing a droplet spraying head.

In FIG. 6, an internal structure of a linear droplet spraying means is explained.

A droplet supplied inside a head 601 from outside is distributed to each nozzle portion 609 to spray the droplet after passing through a common droplet chamber passage 602. Each nozzle portion 609 constitutes a fluid resistance portion 603 provided so that a moderate droplet is charged inside the nozzle, a pressurization chamber 604 to spray the droplet outside the nozzle by applying pressure on the droplet, and a droplet spraying hole 606.

On the side wall of the pressurization chamber 604, a piezoelectric element 605 having piezoelectrical effect such as lead titanate zirconate (Pb (Zr, Ti) O$_3$) which transforms by voltage application is arranged. Therefore, a droplet 607 inside of the pressurization chamber 604 can be sprayed outward by applying voltage to the piezoelectric element 604 arranged in an objective nozzle to push out the droplet 607. In addition, each piezoelectric element is not electrically connected to each other because each piezoelectric element is insulated by an insulating material 608 which is contacted to the element. Therefore, a spray of an individual nozzle can be controlled.

In the invention, although droplet spraying is performed by a so-called piezo method in which a piezoelectric element is used, a so-called thermal ink-jet in which a droplet is pushed out by having heating element generate heat to generate an air bubble according to the kind of a material of the droplet. In this case, it is a structure to substitute the heating element for the piezoelectric element 605.

In addition, in the nozzle portion 609 for droplet spray, wettability of the droplet with the common droplet chamber passage 602, the fluid resistance portion 603, the pressurization chamber 604 and further the droplet spraying hole 606 becomes important. Therefore, a carbon film, a resin film or the like for adjusting wettability with a material may be formed in each of passage.

The droplet can be sprayed on an object to be processed by the aforementioned means. In a droplet spraying method, there are a so-called sequential method in which a continuous linear pattern is formed by spraying a droplet sequentially, and a so-called on demand method in which a droplet is sprayed in dot. Although an on demand method is shown in the apparatus structure in the invention, it is also possible to use a head by a sequential method. Especially, when a continuous linear pattern is formed, a dispenser method may be used.

Figure 7A:
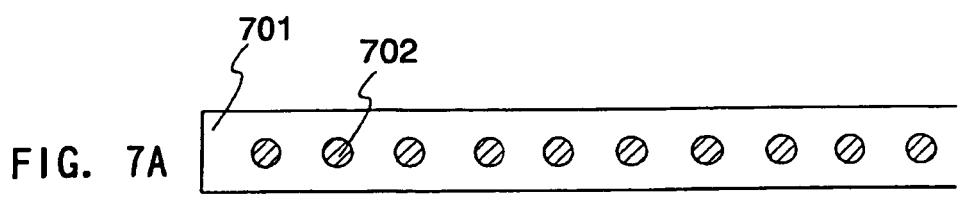
FIGS. 7A to 7C are drawings showing droplet spraying heads.
Figure 7B:
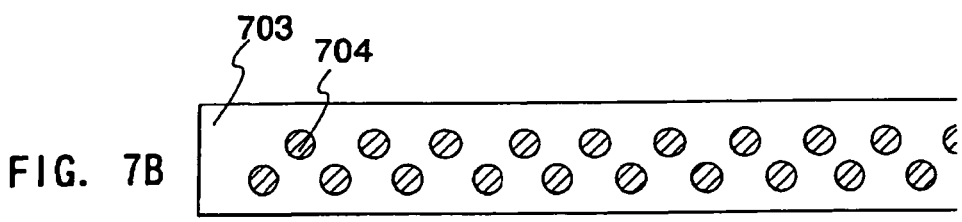
Figure 7C:
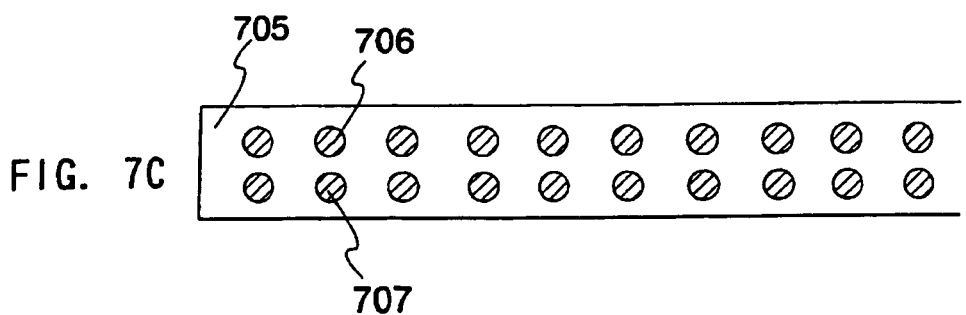

FIGS. 7A to 7C typically show the bottom of the head in the FIG. 7A is a basic arrangement in which droplet spraying holes 702 are arranged linearly on the bottom surface of a head 701. In contrast, in FIG. 7B, droplet spraying holes 704 of a head bottom 703 are made in two rows, and arranged so that each row is shifted by half pitch. In FIG. 7C, droplet spraying holes of a head bottom 705 are arranged by increasing rows without shifting pitch. In the arrangement of FIG. 7C, after droplet spraying from droplet spraying hole 706 of the first step, by spraying a similar droplet on a similar point from a droplet spraying hole 707 with time difference, a droplet can be made thicker by further overpainting a droplet before the droplet which has already been sprayed is dried or solidified on the substrate. In addition, when the droplet spraying hole of the first step is clogged with a droplet or the like, the droplet spraying hole of the second step can be functioned as a spare.

The invention is applicable to various fields such as a wiring forming process of a semiconductor integrated circuit or a wiring forming process of a TFT substrate for forming a liquid crystal panel or an EL panel. That is, the invention is not limited to the illustration in the this embodiment mode. The invention is also applicable when an insulating film such as silicon oxide or acrylic resin is formed, or a semiconductor pattern such as polycrystalline silicon or amorphous silicon is formed.

Embodiment Mode 5

Figure 8:
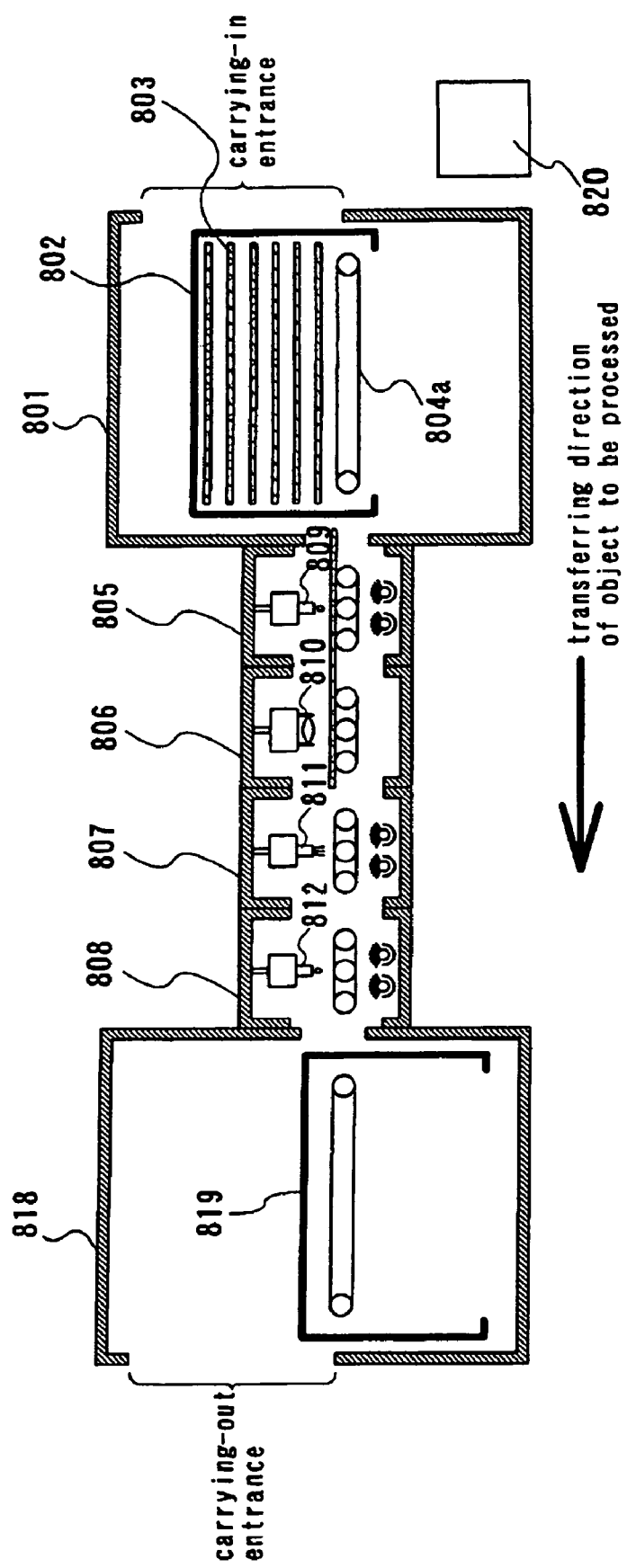
FIG. 8 is a drawing showing semiconductor manufacturing apparatus

This embodiment mode is an example of an apparatus for forming a resist pattern with a reworking function. FIG. 8 is used to describe the embodiment mode.

FIG. 8 shows a side view of an apparatus to be described in the embodiment mode. In the drawing, a desired sized object to be processed 803 in a cassette 802 such as a glass substrate, a resin substrate typified by a plastic substrate, or such as a semiconductor wafer typified by silicon is placed in a load chamber 801. As a transferring means of the object to be processed 803, level transfer is given. However, when a substrate of the post-fifth generation is used, longitudinal transfer in which a substrate is placed longwise may be performed for reducing an occupied area of a transferring device.

A transferring means 804a is arranged in the load chamber 801. The transferring means 804a transfers the arranged object to be processed 803 to a first treatment chamber 805. In the first treatment chamber 805, a resist pattern is formed on the object to be processed 803 by a droplet spraying means 809.

Next, a pattern test is performed in a second treatment chamber 806 if there is a defective portion in the resist pattern formed in the first treatment chamber 805. The second treatment chamber 806 is equipped with an image-taking means 810 for a pattern test. The resist pattern is filmed with the image-taking means 810, and determined if it is a defective pattern or not by comparing with accurate pattern data with a control means 820. When it is determined to be a defective pattern, the position information of the portion is memorized.

Subsequently, the defective pattern is etched and removed in a third treatment chamber 807 according to the position information of the defective pattern obtained by the second treatment chamber 806. When an oxygen gas is used as an etching gas, the resist can be removed easily. In addition, removal efficiency can be further enhanced by combining a fluorine-based gas appropriately. A plasma generating means 811 equipped in the third treatment chamber may be moved to an arbitrary point by using a structure which moves the plasma generating means as described in the embodiment mode 1, or plurality of plasma generating means may be arranged as described in the embodiment mode 2.

Then, in a fourth treatment chamber 808, a resist pattern is formed again in the portion where the defective resist pattern was removed in the third treatment chamber 807 with a droplet spraying means 812. Thereby, reworking of the defective resist pattern is completed.

The object to be processed which goes through the above-mentioned process is finally stored in a cassette 819 in an unload chamber 818.

According to the embodiment mode, yield deterioration due to a defective shape of a resist pattern can be improved. A defect such as a pattern defect has a larger effect on a yield in a later process. The embodiment mode is applicable to the case when a coat pattern is formed directly without using the resist pattern shown in the embodiment mode 1.

Embodiment Mode 6

This embodiment mode describes a flattening apparatus.

Figure 9A:
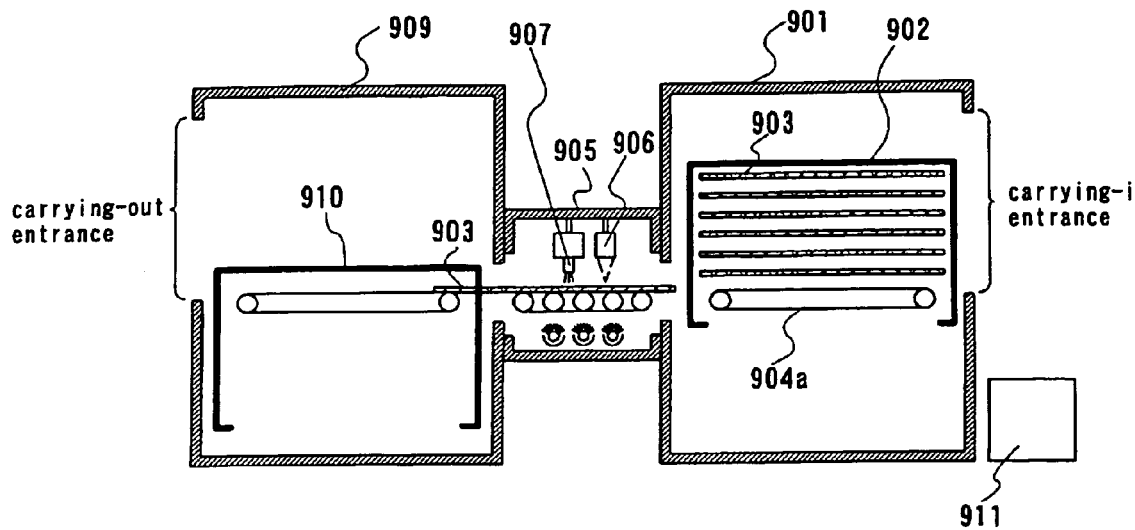
FIGS. 9A to 9B are drawings showing flattening apparatus.
Figure 9B:
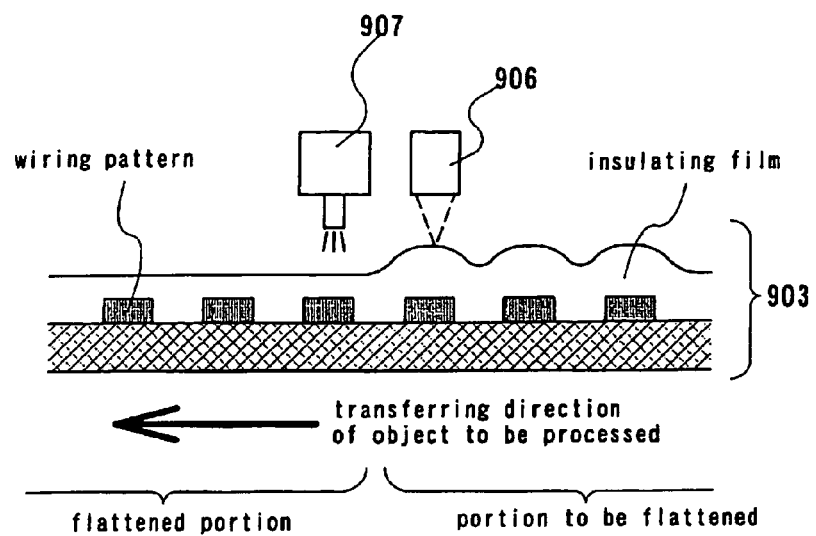

FIG. 9A and FIG. 9B are used to explain the embodiment mode.

FIG. 9A is a side view of a plasma treatment apparatus described in the embodiment mode, and FIG. 9B is a drawing to explain a treatment condition in a treatment chamber 905. An object to be processed in the embodiment mode assumes in a condition that a wiring pattern is formed on the object to be processed for example, and an insulating film is formed further thereon, and the surface of the insulating film is uneven by reflecting the shape of the wiring pattern.

In the drawing, in a load chamber 901, a desired sized object to be processed 903 in a cassette 902 such as a glass substrate, a resin substrate typified by a plastic substrate, or such as a semiconductor wafer typified by silicon is placed. As a transferring means of the object to be processed 903, level transfer is given. However, when a substrate of the post-fifth generation is used, longitudinal transfer in which a substrate is placed longwise may be performed for reducing an occupied area of a transferring device.

A transferring means 904a is arranged in the load chamber 901. The transferring means 904a transfers the arranged object to be processed 903 to the treatment chamber 905.

The treatment chamber 905 is equipped with a surface unevenness detection means 906 and a plasma generating means 907. The surface unevenness detection means 906 and the plasma generating means 907 may be arranged separately in discrete treatment chambers if necessary.

When the object to be processed 903 is brought in the treatment chamber 905, at first, unevenness shape of the surface of the object to be processed 903 is measured by the surface unevenness detection means 906. The result of the measurement is sent to a controlling means 911. As the surface unevenness detection means 906, a known distance sensor or a displacement sensor can be adapted, and either a contact type or a noncontact type may be used. Although more precise measurement is made possible with a contact type, a noncantact type is preferable since the contact type may cause a damage or attaching a contaminant to the object to be processed 903.

After unevenness shape measurement of the surface of the object to be processed 903, the surface of the object to be processed 903 can be planarized by etching and removing the unevenness of the object to be processed 903 by the plasma generating means 907. This is made possible by appropriately changing output of the plasma generating means 907 or the amount of gas flow with the control means 911 based on the shape data obtained by the surface unevenness detection means 906.

The object to be processed which goes through the aforementioned process is finally stored in a cassette 910 in an unload chamber 909.

According to the embodiment mode, it is possible to obtain a flat surface without a CMP method. Therefore, it is eco-friendly since there is no need to use an abrasive which is essential for a CMP method. In addition, it can be expected to improve a yield or a feature because unnecessary pressure is not added to the object to be processed.

Note that the embodiment mode is described emphasizing on planarization. However, it is also possible to manufacture an arbitrary unevenness shape conversely. For example, in a reflection type display device, unevenness shape can be added to a reflection electrode or a film surface in a lower layer to improve reflection efficiency.

EMBODIMENT

Embodiment 1

In this embodiment, using FIG. 10 and FIGS. 11A to 11D, a method for forming a coat pattern on an object to be processed by coupling plurality of treatment chambers to each other is described.

Figure 10:
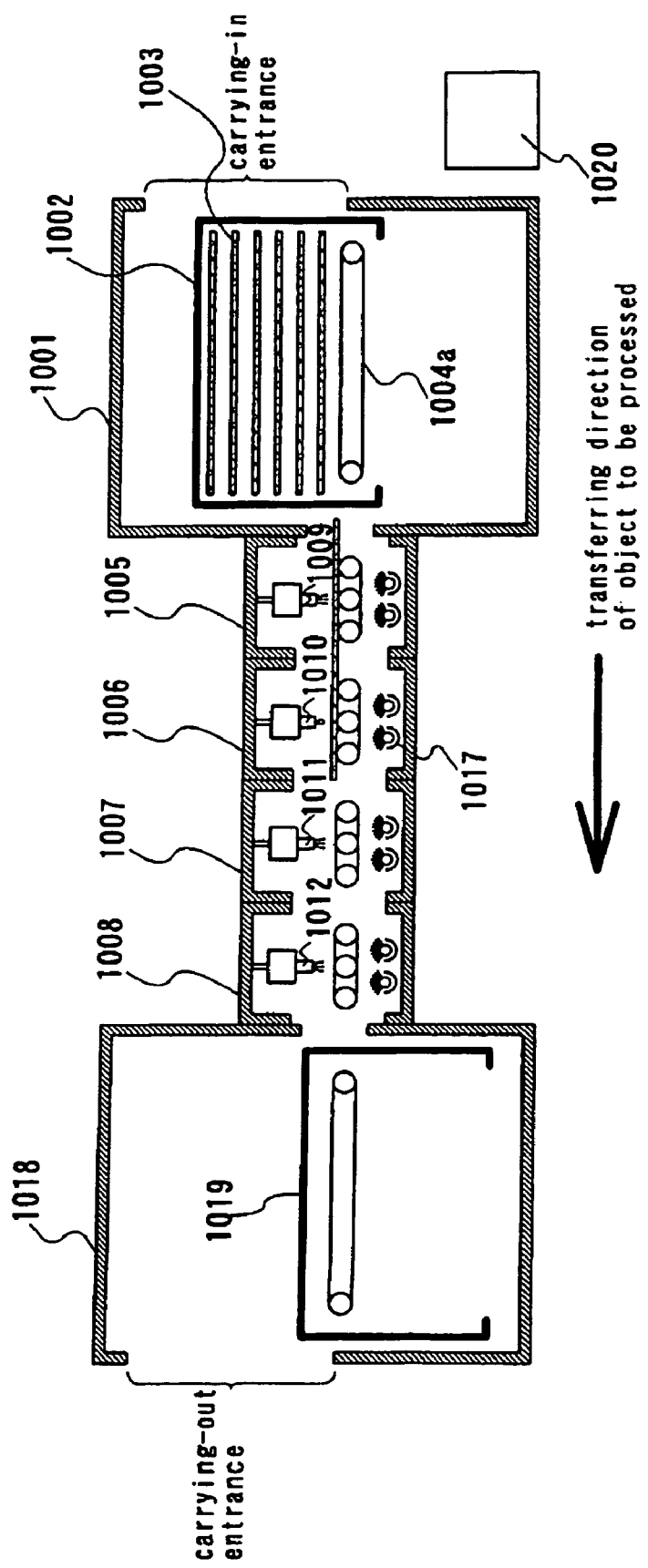
FIG. 10 is a drawing showing a semiconductor manufacturing apparatus.

FIG. 10 is a side view of an apparatus to be described in the embodiment. In the drawings, a desired sized object to be processed 1003 in a cassette 1002 such as a glass substrate, a resin substrate typified by a plastic substrate, or such as a semiconductor wafer typified by silicon is placed in a load camber 1001. As a transferring means of the object to be processed 103, level transfer is given. However, when a substrate of the post-fifth generation is used, longitudinal transfer in which a substrate is placed longwise may be performed for reducing an occupied area of a transferring device.

Figure 11A:
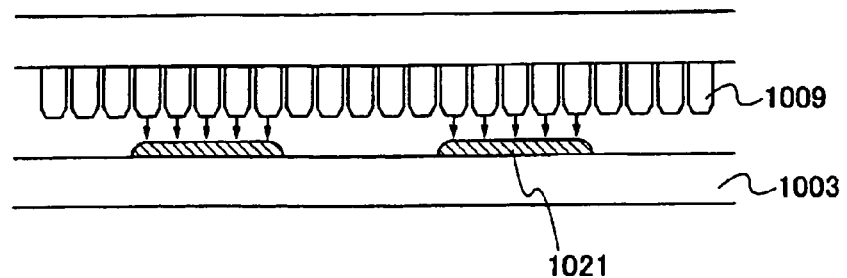
FIGS. 11A to 11D are drawings showing a manufacturing process of a wiring

A transferring means 1004a is arranged in the load chamber 1001. The transferring means 1004a transfers the arranged object to be processed 1003 to a first treatment chamber 1005. A coat 1021 is formed on the object to be processed 1003 as passing to the first treatment chamber 1005. For example, silane or a mixed gas of silane and hydrogen may be used as a material gas when a silicon film is formed. (FIG. 11A).

In the embodiment, a resist pattern is formed in the later process to form a high-precision pattern. However, a coat need not be formed over the entire surface of the object to be processed 1003. The coat may be formed selectively as a pattern which is a little bigger than the resist pattern. Thereby, the formation cost can be reduced because materials or the like are saved.

A plasma generating means 1009 equipped in the first treatment chamber may be moved to an arbitrary point by using a structure which moves the plasma generating means as described in the embodiment mode 1, or plurality of plasma generating means may be arranged as described in the embodiment mode 2.

Figure 11B:
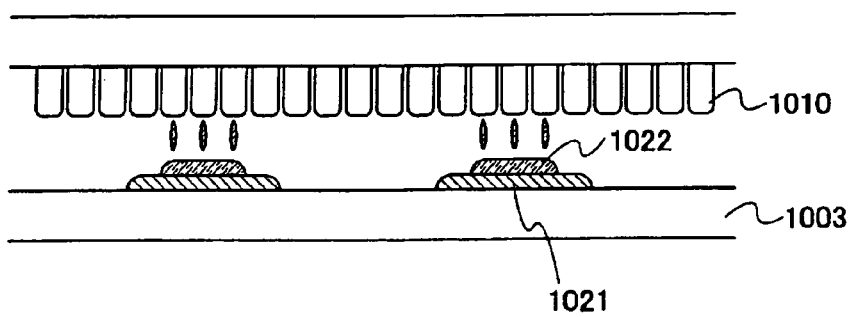

Subsequently, in a second treatment chamber 1006, a resist pattern 1022 is formed on the coat 1021 which is formed in the first treatment chamber 1005 (FIG. 11B). The second treatment chamber is equipped with a droplet spraying means 1010 described in the embodiment mode 3 or the embodiment mode 4, and the resist pattern 1022 is formed by dropping a resist only on a necessary portion based on data being inputted into the controlling means 1020. In addition, bake is completed by a heating means 1017 before the resist pattern which is formed by dropping enters a third treatment chamber 1007. The droplet spraying means equipped in the second treatment chamber may be dot-shaped as described in the embodiment mode 3, or may be linear as described in the embodiment mode 4.

Figure 11C:
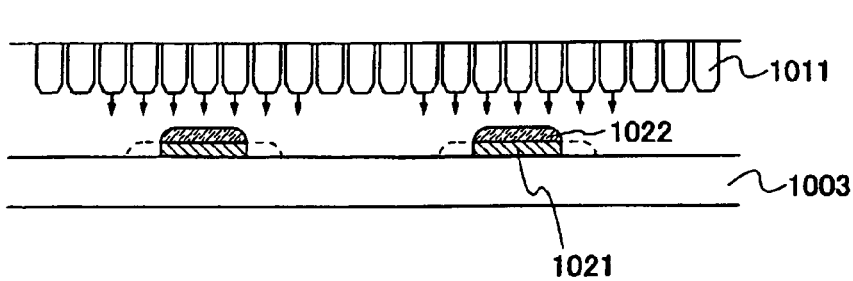

Next, in the third treatment chamber 1007, the coat formed in the first treatment chamber 1005 is etched and removed (FIG. 11C).

At this time, a coat which is underneath a portion where a resist pattern 1022 is formed in the second treatment chamber 1006 is not removed since it is not exposed to an etching gas. As the etching gas, for etching a silicon film for example, a fluorine-based gas, a chlorine gas, a mixed gas of carbon tetrafluoride and oxygen may be used appropriately. A plasma generating means 1011 equipped in the third treatment chamber may be dot-shaped as described in the embodiment mode 1, or may be linear as described in the embodiment mode 2.

Figure 11D:
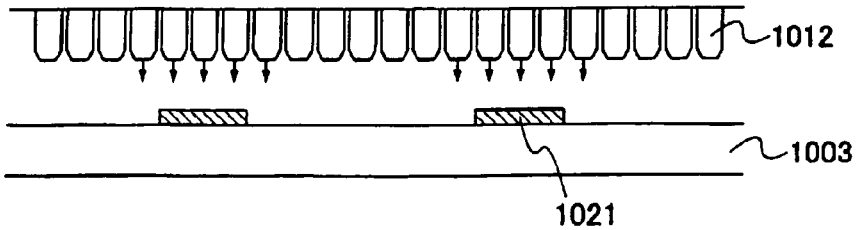

Then, the resist pattern 1022 is removed in a fourth treatment chamber 1008 (FIG. 11D).

The resist pattern can be removed easily because it is an organic substance if an oxygen gas is used as an etching gas. A plasma generating means 1012 equipped with the fourth treatment chamber may be dot-shaped as described in the embodiment mode 1, or may be linear as described in the embodiment mode 2.

The object to be processed which goes through the above-mentioned process is finally stored in a cassette 1019 in an unload chamber 1018.

According to the embodiment, coat formation, resist pattern formation, etching and resist removal are performed on the object to be processed as it is moving continuously. Therefore, a next process can be started before a process is completed, for example, although film formation is performed in a portion on the object to be processed, resist pattern formation is performed in other portion. Consequently, processing time can be reduced dramatically. At this time, processing speed of a plasma generating means or a droplet spraying means should be optimized to keep time for passing through each treatment chamber constant. In addition, although it is important to keep processing temperature constant in each treatment chamber, in the case that the processing temperature is different among the treatment chambers, a cooling mechanism may be provided in addition to a heating mechanism if necessary. In addition to saving raw materials or the like, an apparatus occupied area can be made smaller because it becomes possible to make the treatment chamber smaller than the object to be processed.

Embodiment 2

This embodiment describes a method for manufacturing an electro-optic device using a droplet spraying apparatus having a droplet spraying head in which the dot-shaped droplet spraying holes are arranged in linear, and a plasma treatment apparatus having a plasma generating means under atmospheric pressure. FIGS. 12A to 14 are used to describe the embodiment.

As a design rule of application of a large-sized display television in particular, a pixel pitch of both length and breadth is set around 50 to 750 µm; a gate metal (a capacitor wiring), around 5 to 50 µm; a source wiring, around 5 to 25 µm; and a contact hole, around 2.5 to 30 µm.

Figure 12A:
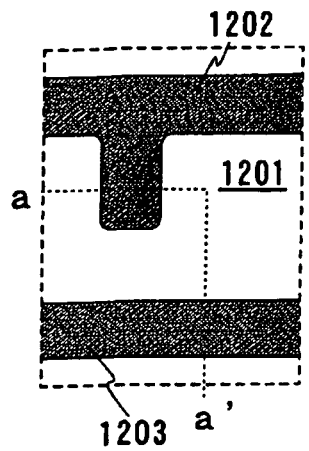
FIGS. 12A to 12C are drawings showing a manufacturing process of a thin film transistor.
Figure 12A:
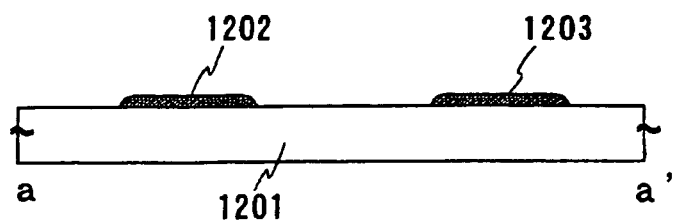

On an object to be processed 1201 comprising a material such as glass, quartz, semiconductor, a plastic, a plastic film, metal, glass epoxy resin and ceramic, a droplet having conductivity is sprayed on a necessary point by the droplet spraying apparatus of the present invention. Thereby, a gate electrode and a wiring 1202, and a capacitor electrode and a wiring 1203 are formed (FIG. 12A).

Here, as a composition sprayed from a spraying hole by a droplet spraying method, a conductive material which is dissolved or dispersed in a solvent is used. The conductive material corresponds to metal such as Ag, Au, Cu, Ni, Pt, Pd, Ir, Rh, W or Al, metal sulfide of Cd or Zn, oxide of Fe, Ti, Si, Ge, Si, Zr or Ba, or a particle or a dispersive nanoparticle of silver halide. In addition, the conductive material corresponds to indium tin oxide (ITO), ITSO comprising indium tin oxide and silicon oxide, organic indium, organotin, zinc oxide, titanium nitride or the like. However, as a composition sprayed from a droplet spraying hole, it is preferable to use a composition in which any material of Au, Ag or Cu is dissolved or dispersed into a solvent in view of a specific resistance value. More preferably, low resistance Au or Cu may be used. However, when Au or Cu is used, a barrier film may be formed together for an anti-impurity measure. As a barrier film, a silicon nitride film or nickel boron (NiB) can be used.

In addition, a particle in which other conductive material is coated around a conductive material to form plurality of layers may be used. For example, a three-layer structure particle in which nickel boron (NiB) is coated around copper, and silver is coated therearound may be used. As a solvent, ester such as butyl acetate or ethyl acetate, alcohol such as isopropyl alcohol or ethyl alcohol, an organic solvent such as methyl ethyl ketone or acetone or the like is used. The viscosity of the composition is preferably equal to or less than 20 cP. This is because it can prevent drying or make it possible to spray the composition from the spraying hole smoothly. In addition, the surface tension of the composition is preferably equal to or less than 40 mN/m. However, the viscosity or the like of the composition may be adjusted appropriately in accordance with a solvent used or application. As an example, the viscosity of the composition in which ITO, organic indium or organotin is dissolved or dispersed into a solvent may be set 5 to 50 mPa·s, the viscosity of the composition in which Ag is dissolved or dispersed into a solvent may be set 5 to 20 mPa·s, the viscosity of the composition in which Au is dissolved or dispersed in a solvent may be set 10 to 20 mPa·s.

In addition, the diameter of a nozzle used for a droplet spraying means is set 0.1 to 50 μm (preferably 0.6 to 26 μm), and the amount of spraying of the composition sprayed from the nozzle is set 0.00001 pl to 50 pl (preferably 0.0001 to 40 pl). The amount of spraying increases in proportion to the size of the diameter of the nozzle. In addition, it is preferable to bring the distance between an object to be processed and the nozzle spraying hole close to each other as much as possible to drop at an arbitrary point. Preferably, it is set about 0.1 to 2 mm. In addition, the amount of spraying can be controlled by changing the pulse voltage applied to a piezoelectric element without changing the diameter of the nozzle. It is preferable to set these spraying conditions to have the liner width of equal to or less than 10 μm.

Next, a conductive wiring is formed by performing heating treatment on a substrate over which the gate electrode and wiring 1202 and the capacitor electrode and wiring 1203 are formed to volatilize the solvent of the droplet.

The conductive wiring may be formed by forming a resist pattern directly with a droplet spraying apparatus when processing accuracy is required, although the resist pattern is not necessary when processing accuracy is not highly required. In this case, there is no need for forming the droplet having the conductivity on the entire surface of the object to be processed. Instead, it may be formed as a little bigger pattern than the resist pattern.

Figure 12B:
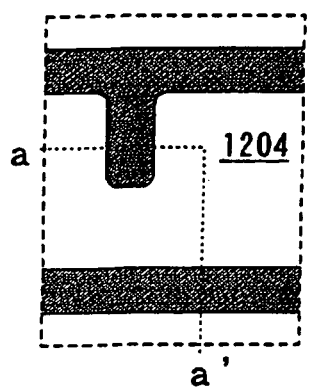
Figure 12B:
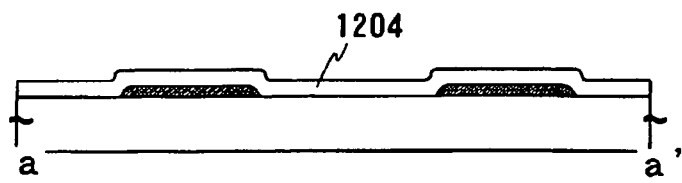

A gate insulating film 1204 is formed by using a plasma treatment apparatus such as the one described in the embodiment mode 1 or the embodiment mode 2 (FIG. 12B). In the embodiment, although a silicon nitride film is formed as the gate insulating film 1204 by a CVD method under atmospheric pressure, a silicon oxide film or a lamination structure thereof may be formed, or other insulating materials may be used.

Figure 12C:
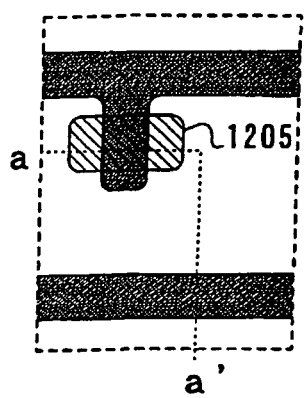
Figure 12C:
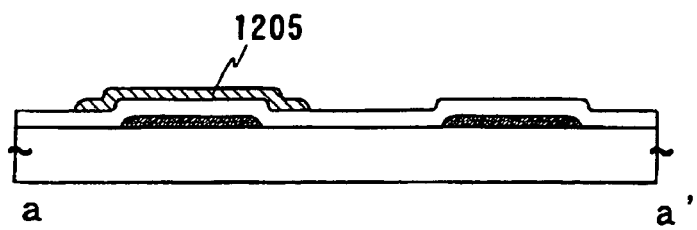

Subsequently, an active semiconductor layer 1205 is formed with a thickness of 25 to 80 nm (preferably 30 to 60 nm) (FIG. 12C). The active semiconductor layer 1205 is an amorphous semiconductor film typified by an amorphous silicon film. The formation cost can be reduced by forming the active semiconductor layer 1205 only on a necessary portion the same as the case of forming the gate electrode and wiring 1202 and the capacitor electrode and wiring 1203. Nonetheless, the active semiconductor pattern may be formed by forming a resist pattern directly by the droplet spraying apparatus when the further processing accuracy is required.

Figure 13A:
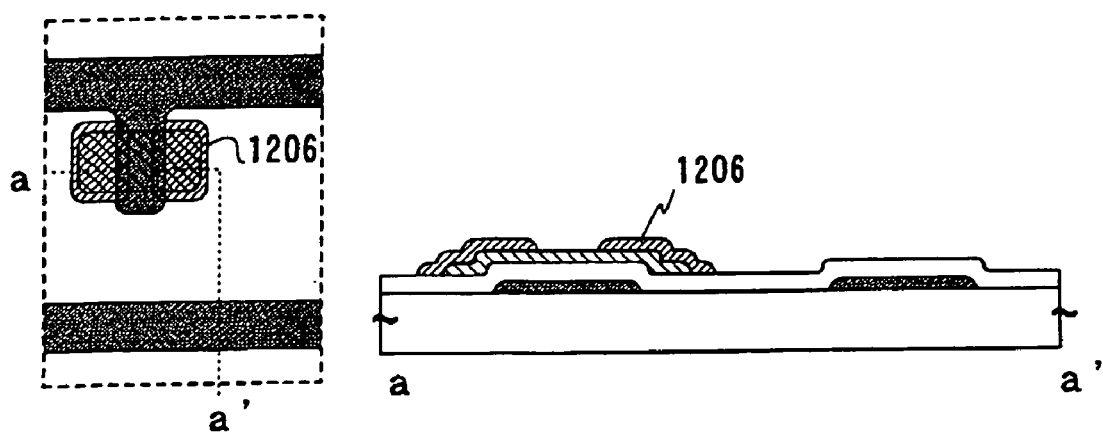
FIGS. 13A to 13C are drawings showing a manufacturing process of a thin film transistor.

Then, an amorphous semiconductor film 1206 to which an impurity element imparting an n-type conductivity type is added is formed on the active semiconductor layer 1205 (FIG. 13A).

Figure 13B:
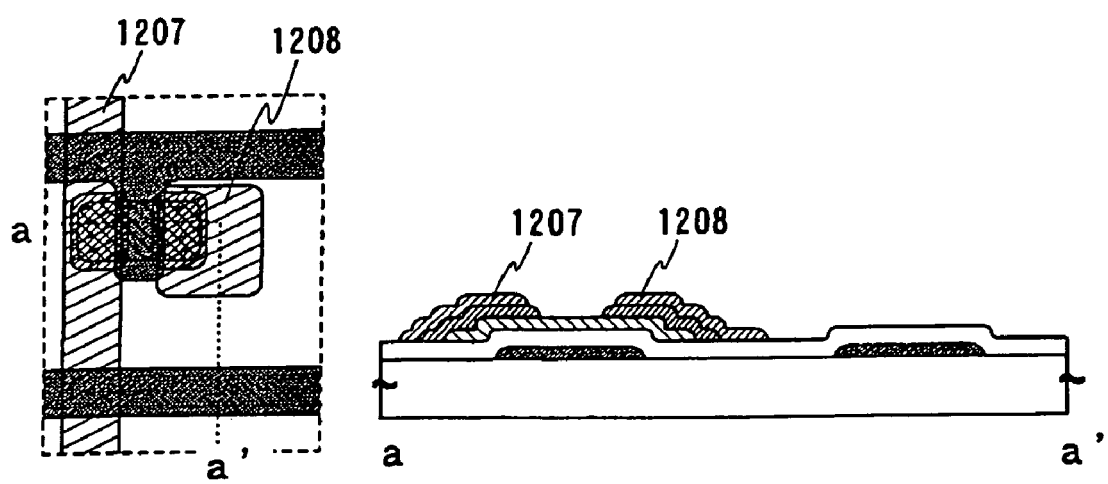

Next, source and drain electrodes and wirings 1207 and 1208 are formed by using the linear droplet spraying apparatus of the present invention (FIG. 13B). In addition, as for the source and drain electrodes and the wirings 1207 and 1208, accuracy of the pattern shape can be enhanced by using a resist pattern the same as the gate electrode and wiring 1202 and the capacitor electrode and wiring 1203 described in FIG. 12A if necessary.

Figure 13C:
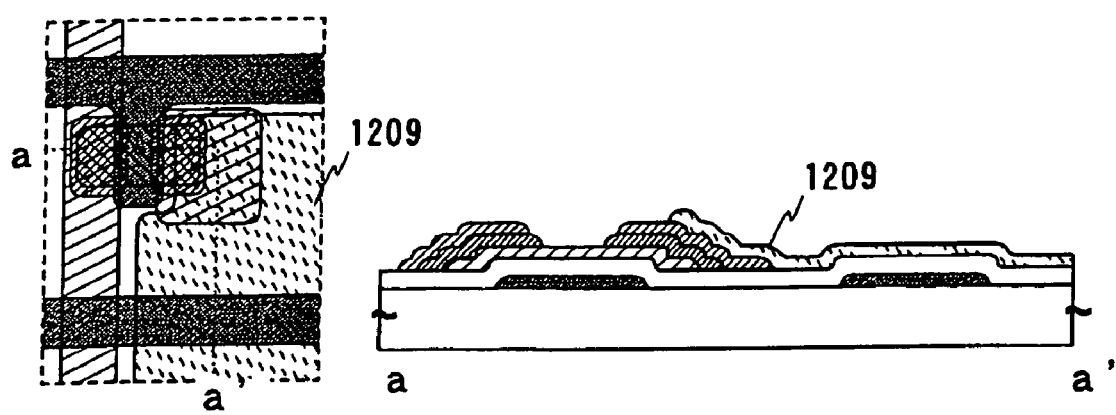

Afterward, a pixel electrode 1209 is formed by the droplet spraying apparatus (FIG. 13C). The pixel electrode 1209 may be drawn directly by the droplet spraying apparatus or may be formed by performing patterning the same as the gate electrode and wiring 1202 and the capacitor electrode and the wiring 1203 shown in FIG. 12A.

Figure 14:
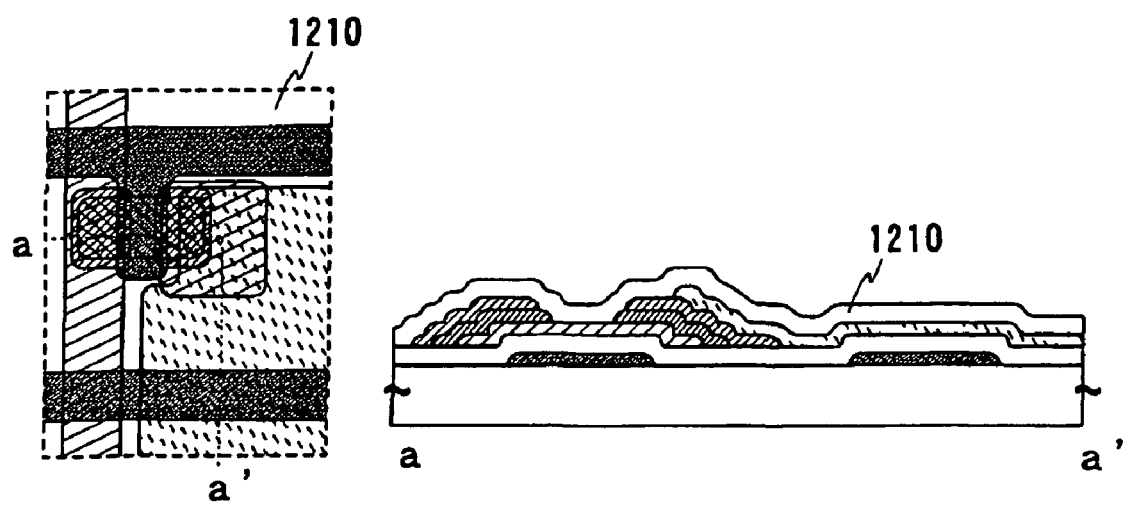
FIG. 14 is a drawing showing a manufacturing process of a thin film transistor.

Furthermore, a silicon nitride film is formed as a protective film 1210 (FIG. 14). In the embodiment, although the silicon nitride film is formed as the protective film 1210, a silicon oxide film or a lamination structure thereof may be formed, or other insulating materials may be used. In addition, an organic resin film such as an acrylic film may be used.

Embodiment 3

Various types of electronic devices can be completed according to the present invention. The a practical examples are described by using FIGS. 15A to 15C.

Figure 15A:
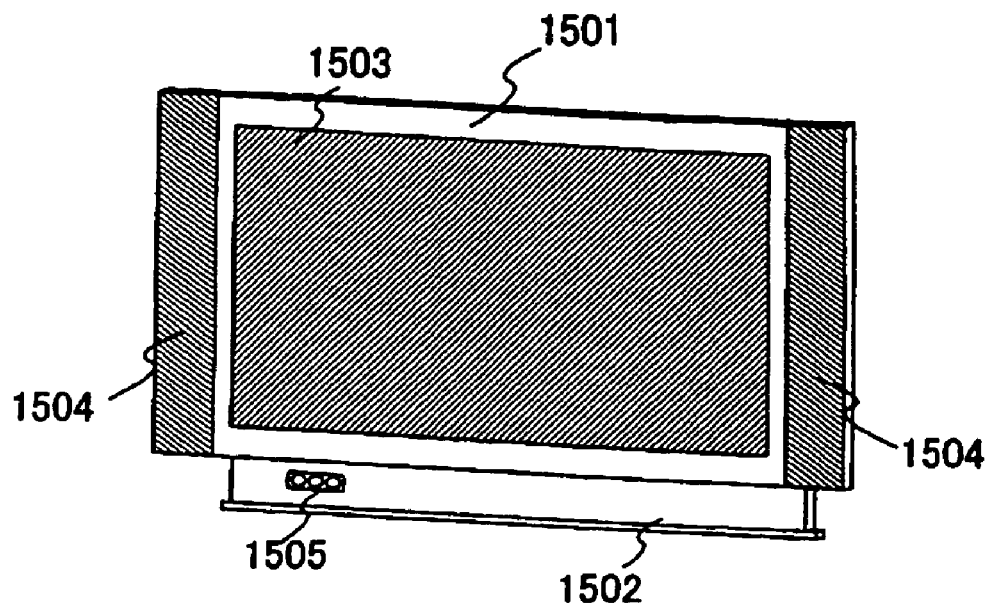
FIGS. 15A to 15C are drawings showing electronics devices.

FIG. 15A illustrates a display device having a large-sized display portion of for example, 20 to 80 inches, which includes a casing 1501, a support base 1502, a display portion 1503, speaker portions 1504, video input terminals 1505 and the like. The invention is applied to manufacturing of display portion 1503. It is preferable to manufacture this kind of large-sized display device by using a large substrate such as the so-called fifth generation (1000×1200 mm), the sixth generation (1400×1600 mm) or the seventh generation (1500×1800 mm) from productivity and cost point of view.

Figure 15B:
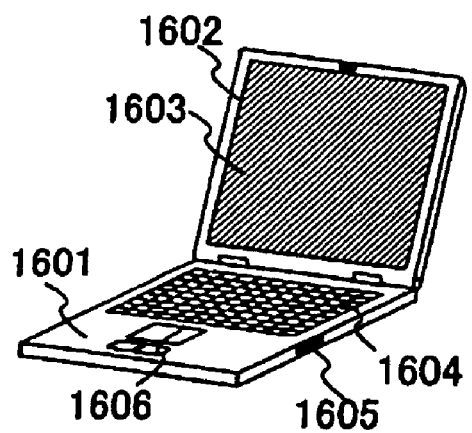

FIG. 15B illustrates a lap-top personal computer, which includes a main body 1601, a casing 1602, a display portion 1603, a keyboard 1604, an external connection port 1605, a pointing mouse 1606 and the like. The invention is applied to manufacturing of the display portion 1603.

Figure 15C:
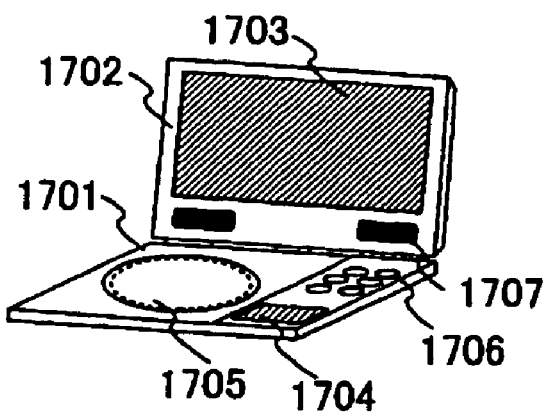

FIG. 15C illustrates a portable image reproduction device including a recording medium (specifically, a DVD reproduction device), which includes a main body 1701, a casing 1702, a display portion A 1703, a display portion B 1704, a recording medium (a DVD or the like) reading portion 1705, operation keys 1706, speaker portions 1707 and the like. The display portion A 1703 is used mainly for displaying image information, while the display portion B 1704 is used mainly for displaying character information. The invention is applied to manufacturing of these display portions A and B, 1703 and 1704.

As described above, the application range of the invention is quite wide, and the invention is applicable to manufacturing of electronics devices in all fields. In addition, the invention can be freely combined with the aforementioned embodiment mode or the embodiments.

Embodiment 4

In this embodiment, a composition in which a metal minute particle is dispersed into an organic solvent is used to form a wiring pattern. As the metal minute particle, a metal minute particle which has the average diameter of 1 to 50 nm, preferably, 3 to 7 nm is used. Typically, it is a minute particle of silver or gold, and the surface of the minute particle is covered with a dispersing agent such as amine, alcohol or thiol. The organic solvent is phenol resin or epoxy resin, and the one having thermosetting properties or photo-curable properties is used. The viscosity of the composition may be adjusted by adding a thixo agent or a dilution solvent.

The composition discharged with the appropriate amount on the surface to be formed is cured the organic solvent by heat treatment or light irradiation treatment with a droplet spraying means. The metal minute particles contact to each other by volumetric shrinkage with curing of the organic solvent, and fusion, welding or cohesion is promoted. In other words, a wiring in which a metal minute particle having the average diameter of 1 to 50 nm, preferably 3 to 7 nm is fused, welded or cohered is formed. In this way, lowering a resistance of a wiring can be realized by forming a condition in which the face of metal minute particles contact to each other by fusion, welding or cohesion.

According to the present invention, it becomes easy to form a wiring pattern which has the line width of about 1 to 10 μm by forming the wiring pattern with the use of such a composition. In addition, although when the diameter of the contact hole is about 1 to 10 μm, the inside can be filled up with the composition. That is a multilayer interconnection structure can be formed with a minute wiring pattern.

In addition, when a minute particle of an insulating substance is used instead of a metal minute particle, a pattern with an insulating property can be formed likewise.

In addition, the embodiment can be freely combined with the abovementioned embodiment mode and the embodiments.

Industrial Applicability

According to the present invention, a significant quality improvement, a productivity improvement, reduction in the manufacturing cost can be realized in manufacturing of a display panel because reduction in space and improvement of efficiency of a production line can be realized. In addition, a high-speed and continuous processing becomes possible because the invention is an atmospheric pressure method in which an in-line processing coupled with production is possible.

The invention claimed is:

1. A semiconductor manufacturing apparatus comprising:
a plasma generating device for generating a plasma;
a first chamber for performing a plasma treatment on a first part of an object by the plasma therein under atmospheric pressure or approximate to atmospheric pressure;
a rail for sliding the plasma generating device, the rail provided in the first chamber; and
an ink-jet device for applying a droplet to a second part of the object simultaneously with performing the plasma treatment,
wherein the plasma generating device is provided in the first chamber,
wherein the ink-jet device is provided in a second chamber; and
wherein the object is level transferred in the first chamber along a first direction and the plasma generating device is moved in the first chamber along the rail and along a second direction intersecting with the first direction and in a direction parallel to a side of the object.

2. A semiconductor manufacturing apparatus according to claim 1, wherein the first direction is a unidirection.

3. A semiconductor manufacturing apparatus according to claim 1, wherein the object is level transferred continuously or with the use of step-feed.

4. A semiconductor manufacturing apparatus according to claim 1, wherein the plasma treatment is performed by the plasma generating device for forming a film over the object, etching the object, or ashing the object.

5. A semiconductor manufacturing apparatus according to claim 1, wherein the plasma treatment is performed by the plasma generating device while transferring the object and moving the plasma generating device.

6. A semiconductor manufacturing apparatus according to claim 1 wherein the plasma generating device comprises a first electrode and a second electrode for generating a plasma between the first electrode and the second electrode, and the first electrode and the second electrode have a nozzle-shaped opening.

7. A semiconductor manufacturing apparatus according to claim 1 wherein the object comprises a glass.

8. A semiconductor manufacturing apparatus according to claim 1 wherein the object comprises a quartz.

9. A semiconductor manufacturing apparatus according to claim 1 wherein the object comprises a semiconductor.

10. A semiconductor manufacturing apparatus according to claim 1 wherein the object comprises a metal.

11. A semiconductor manufacturing apparatus according to claim 1 wherein the object comprises a ceramic.

12. A semiconductor manufacturing apparatus comprising:
a first plasma generating device for generating a first plasma;
a second plasma generating device for generating a second plasma;
a first chamber for performing a first plasma treatment on a first part of an object by the first plasma therein under atmospheric pressure or approximate to atmospheric pressure;
a second chamber for performing a second plasma treatment on the object by the second plasma therein under atmospheric pressure or approximate to atmospheric pressure; and
an ink-jet device for applying a droplet to a second part of the object simultaneously with performing the first plasma treatment,
wherein the first plasma generating device is provided in the first chamber and the second plasma generating device is provided in the second chamber,
wherein the ink-jet device is provided in a third chamber,
wherein the object is level transferred in the first chamber, the second chamber and the third chamber along a first direction and the first plasma generating device is moved in the first chamber along a second direction intersecting with the first direction and in a direction parallel to a side of the object.

13. A semiconductor manufacturing apparatus according to claim 12, wherein the applying of the droplet is performed to a surface of the second part of the object under atmospheric pressure or approximate to atmospheric pressure.

14. A semiconductor manufacturing apparatus according to claim 12, wherein the first direction is a unidirection.

15. A semiconductor manufacturing apparatus according to claim 12, wherein the object is level transferred continuously or with the use of step-feed.

16. A semiconductor manufacturing apparatus according to claim 12, wherein the droplet is an organic solvent containing organic resin or metal element.

17. A semiconductor manufacturing apparatus according to claim 12, wherein the droplet is attached onto a surface of the second part of the object while transferring the object and moving the ink-jet device.

18. A semiconductor manufacturing apparatus according to claim 12, wherein each of the first plasma treatment and the second plasma treatment is performed for forming a film over the object, etching the object, or ashing the object.

19. A semiconductor manufacturing apparatus according to claim 12 wherein each of the first plasma generating device and the second plasma generating device comprises a first electrode and a second electrode for generating a plasma between the first electrode and the second electrode, and the first electrode and the second electrode have a nozzle-shaped opening.

20. A semiconductor manufacturing apparatus according to claim 12 wherein the ink-jet device comprises a nozzle provided with a hole for pushing out the droplet from the hole.

21. A semiconductor manufacturing apparatus according to claim 12 wherein the object comprises a glass.

22. A semiconductor manufacturing apparatus according to claim 12 wherein the object comprises a quartz.

23. A semiconductor manufacturing apparatus according to claim 12 wherein the object comprises a semiconductor.

24. A semiconductor manufacturing apparatus according to claim 12 wherein the object comprises a metal.

25. A semiconductor manufacturing apparatus according to claim 12 wherein the object comprises a ceramic.

26. A semiconductor manufacturing apparatus comprising:
at least one plasma generating device for generating a plasma;
a first chamber for performing a plasma treatment on a first part of an object by the plasma therein under atmospheric pressure or approximate to atmospheric pressure;
a rail for sliding the plasma generating device, the rail provided in the first chamber; and
at least one ink-jet device for applying a droplet to a second part of the object simultaneously with performing the plasma treatment;
wherein the plasma generating device is provided in the first chamber,
wherein the ink-jet device is provided in a second chamber,
wherein the object is level transferred in the first chamber along a first direction and the plasma generating device is moved in the first chamber along the rail and along a second direction intersecting with the first direction and in a direction parallel to a side of the object, and
wherein the ink-jet device is moved in the second chamber along a third direction intersecting with the first direction.

27. A semiconductor manufacturing apparatus according to claim 26, wherein the plasma treatment is performed by the plasma generating device for forming a film over the first part of the object, etching the first part of the object or ashing the first part of the object.

28. A semiconductor manufacturing apparatus according to claim 26, wherein the first direction is a unidirection.

29. A semiconductor manufacturing apparatus according to claim 26, wherein the object is level transferred continuously or with the use of step-feed.

30. A semiconductor manufacturing apparatus according to claim 26, wherein the plasma treatment is performed by the plasma generating device while transferring the object and moving the plasma generating device.

31. A semiconductor manufacturing apparatus according to claim 26, wherein the applying of the droplet is performed to a surface of the second part of the object under atmospheric pressure or approximate to atmospheric pressure.

32. A semiconductor manufacturing apparatus according to claim 26, wherein the droplet is an organic solvent containing resin or metal element.

33. A semiconductor manufacturing apparatus according to claim 26, wherein the droplet is attached onto a surface of the second part of the object while transferring the object and moving the ink-jet device.

34. A semiconductor manufacturing apparatus according to claim 26 wherein the plasma generating device comprises a first electrode and a second electrode for generating a plasma between the first electrode and the second electrode, and the first electrode and the second electrode have a nozzle-shaped opening.

35. A semiconductor manufacturing apparatus according to claim 26 wherein the ink-jet device comprises a nozzle provided with a hole for pushing out the droplet from the hole.

36. A semiconductor manufacturing apparatus according to claim 26 wherein the object comprises a glass.

37. A semiconductor manufacturing apparatus according to claim 26 wherein the object comprises a quartz.

38. A semiconductor manufacturing apparatus according to claim 26 wherein the object comprises a semiconductor.

39. A semiconductor manufacturing apparatus according to claim 26 wherein the object comprises a metal.

40. A semiconductor manufacturing apparatus according to claim 26 wherein the object comprises a ceramic.

* * * * *